(12) United States Patent
Furuya

(10) Patent No.: US 9,806,495 B2
(45) Date of Patent: Oct. 31, 2017

(54) OPTICAL MODULE, METHOD FOR FABRICATING THE SAME

(71) Applicant: SUMITOMO ELECTRIC INDUSTRIES, LTD., Osaka (JP)

(72) Inventor: Akira Furuya, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/188,353

(22) Filed: Jun. 21, 2016

(65) Prior Publication Data

US 2016/0372886 A1 Dec. 22, 2016

(30) Foreign Application Priority Data

Jun. 22, 2015 (JP) .................................. 2015-124833

(51) Int. Cl.
 *G02B 7/02* (2006.01)
 *H01S 5/022* (2006.01)
 *G02B 7/00* (2006.01)

(52) U.S. Cl.
 CPC ............ *H01S 5/02252* (2013.01); *G02B 7/00* (2013.01); *G02B 7/003* (2013.01); *G02B 7/02* (2013.01); *H01S 5/02248* (2013.01); *H01S 5/02216* (2013.01); *H01S 5/02288* (2013.01); *H01S 5/02296* (2013.01)

(58) Field of Classification Search
 CPC ............ H01S 5/02252; H01S 5/02248; H01S 5/02216; H01S 5/02288; H01S 5/02296; G02B 7/00; G02B 7/02; G02B 7/003
 USPC ......................................... 359/738, 811, 819
 See application file for complete search history.

(56) References Cited

U.S. PATENT DOCUMENTS

2005/0083568 A1* 4/2005 Nakae .................... B82Y 20/00
359/341.3

OTHER PUBLICATIONS

Peter De Dobbelaere, "Silicon Properties Technology Platform for High Speed Interconnect", http://www.semiconwest.org/sites/semiconwest.org/files/docs Luxtera.pdf, accessed on Dec. 23, 2014 (Oct. 7, 2013).
Peter De Dobbelaere, "Packaging of Silicon Photonics Systems, OFC 2014, W3I.2.", Luxtera Inc.
Peter De Dobbelaere, "Light source approach for silicon photonics transceivers", Sep. 2014, http://www.ecoc2014.org/sunday-workshops.html, accessed on Jun. 3, 2016, ECOC2014, WS1.

* cited by examiner

*Primary Examiner* — William Choi
(74) *Attorney, Agent, or Firm* — Smith, Gambrell & Russell, LLP

(57) ABSTRACT

An optical module includes: a bench part including a bench having a principal surface including first and second areas arranged in a direction of a first axis, a semiconductor optical device disposed on the first area, and a lens disposed on the first area; and a cap including a base made of silicon, the cap being disposed on the bench part. The cap has a cavity containing the semiconductor optical device and the lens, and includes a ceiling extending along a first reference plane, a front wall extending from the ceiling along a second reference plane, and a rear wall extending from the ceiling in a direction from the cap to the bench. The semiconductor optical device, the lens and the cap are arranged along an optical reference plane. The second reference plane is inclined with respect to the first reference plane.

3 Claims, 19 Drawing Sheets

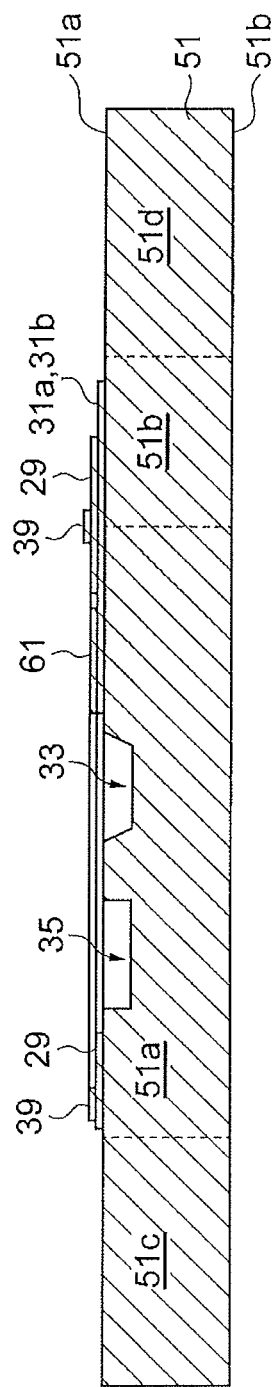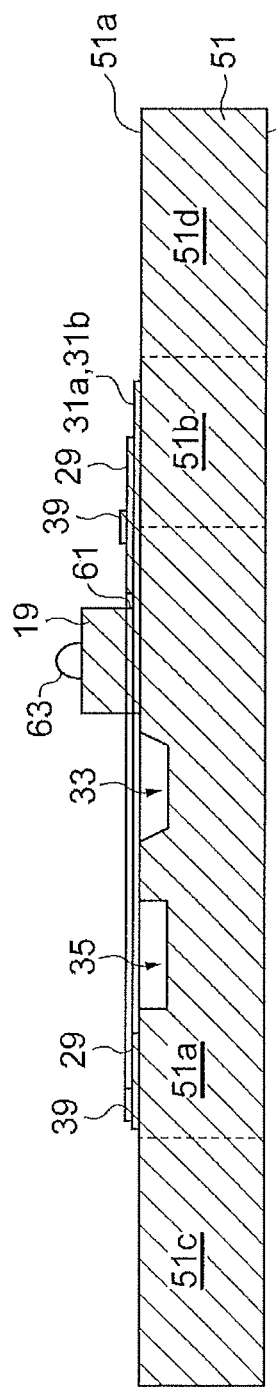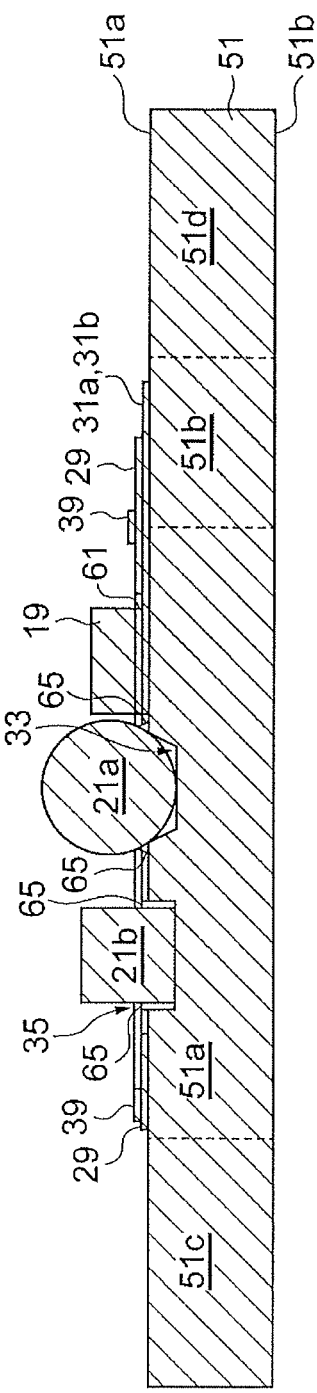

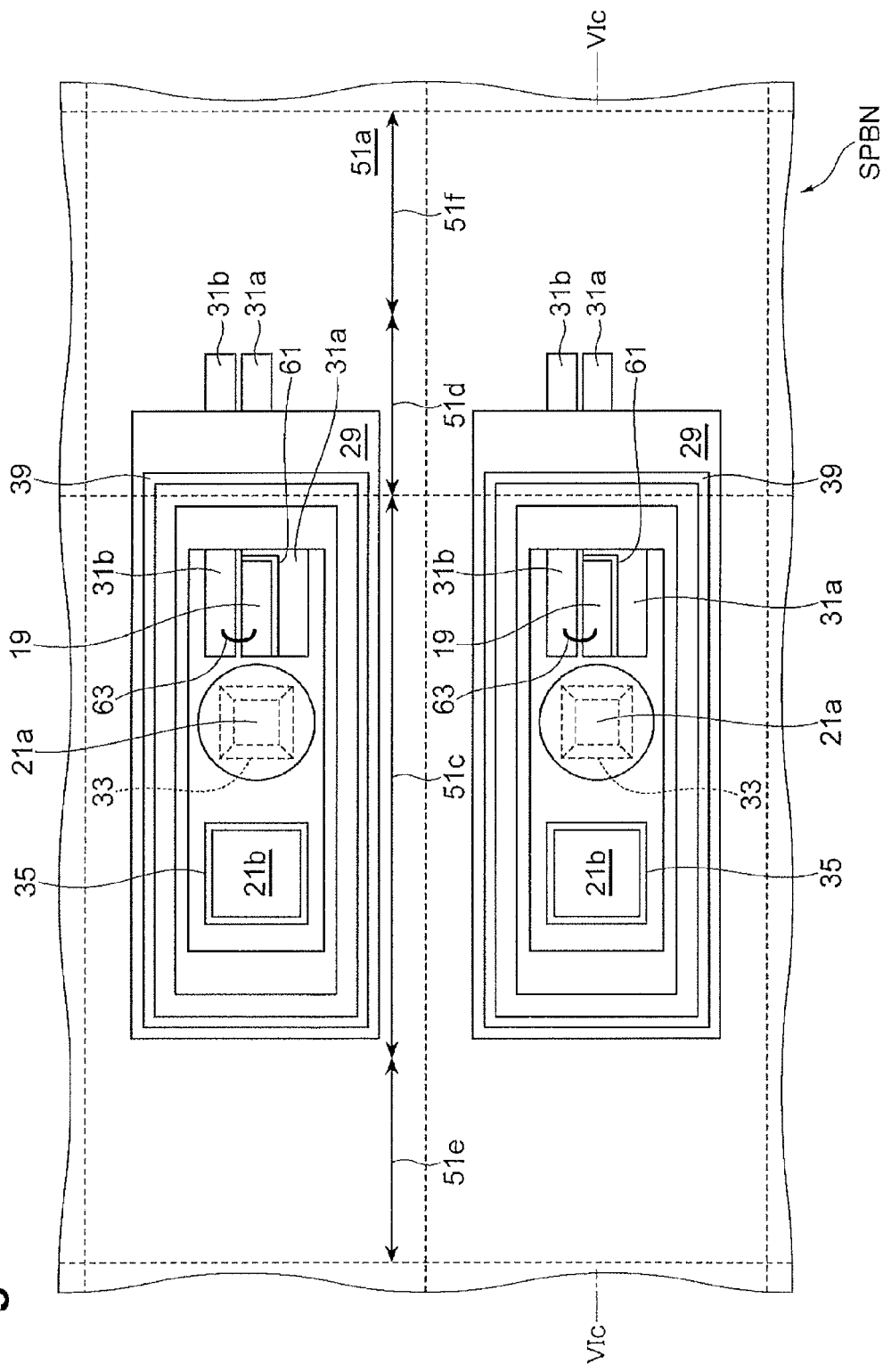

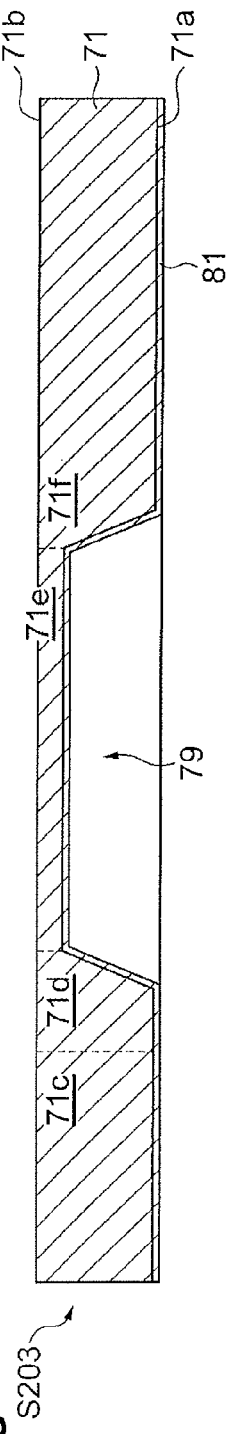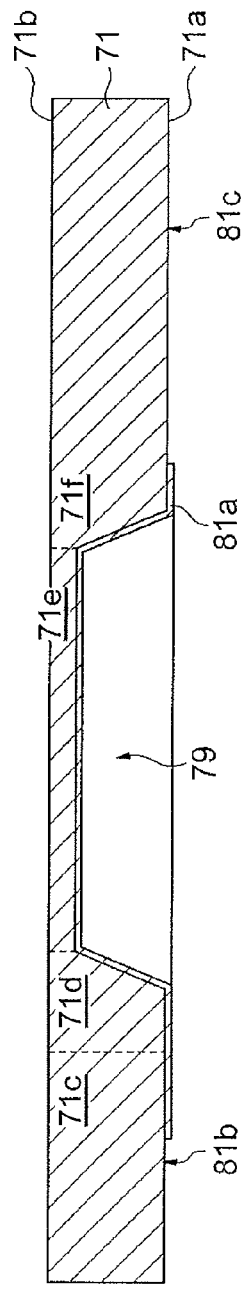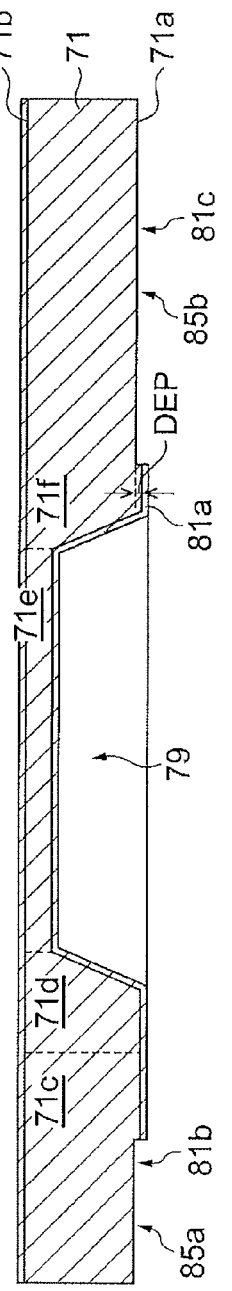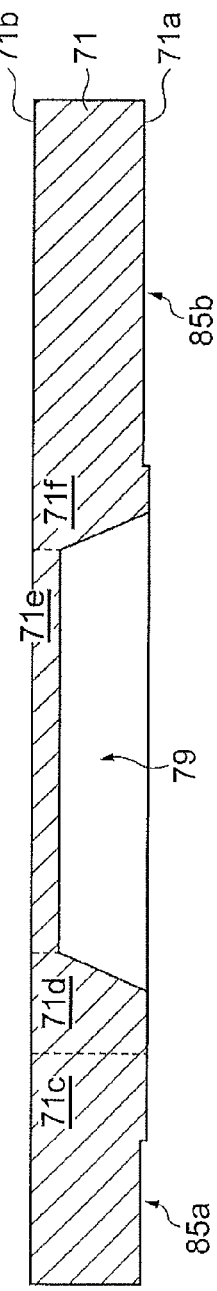

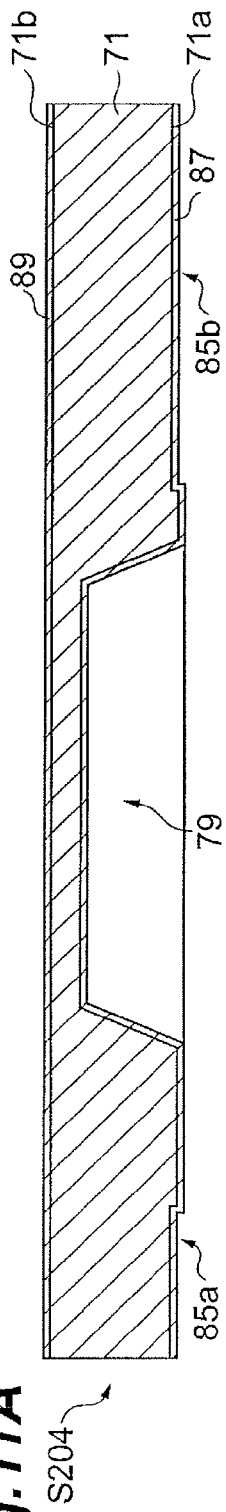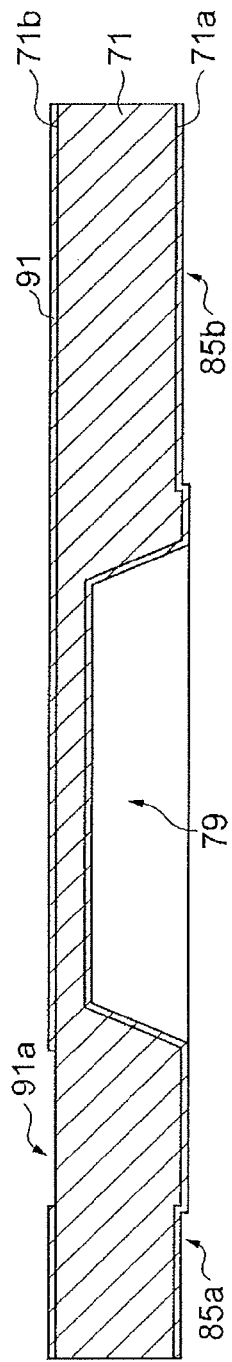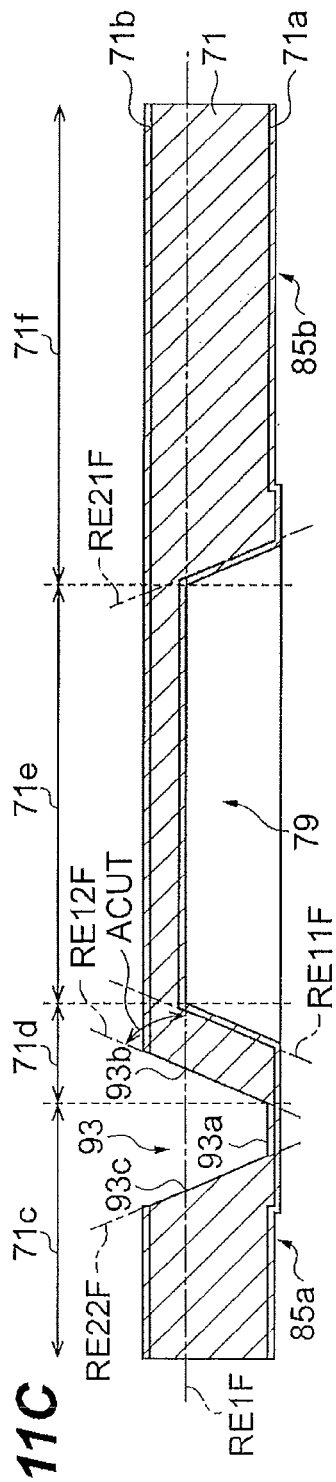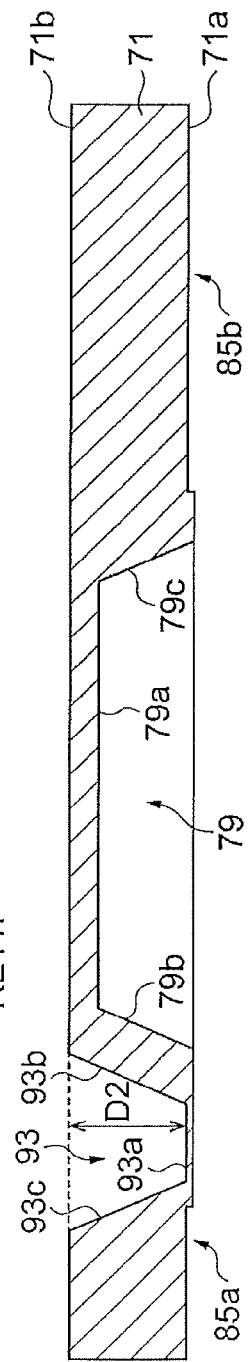

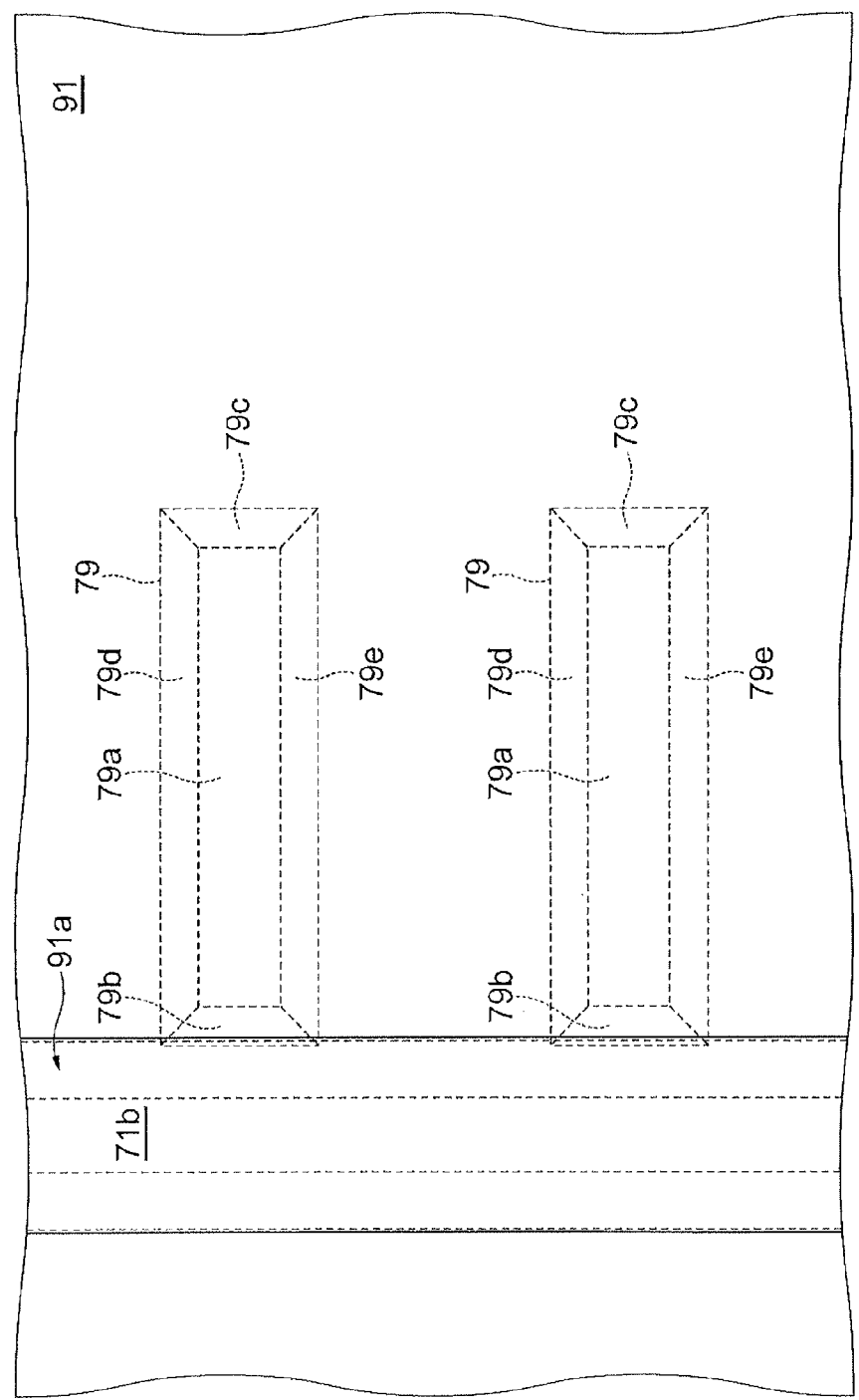

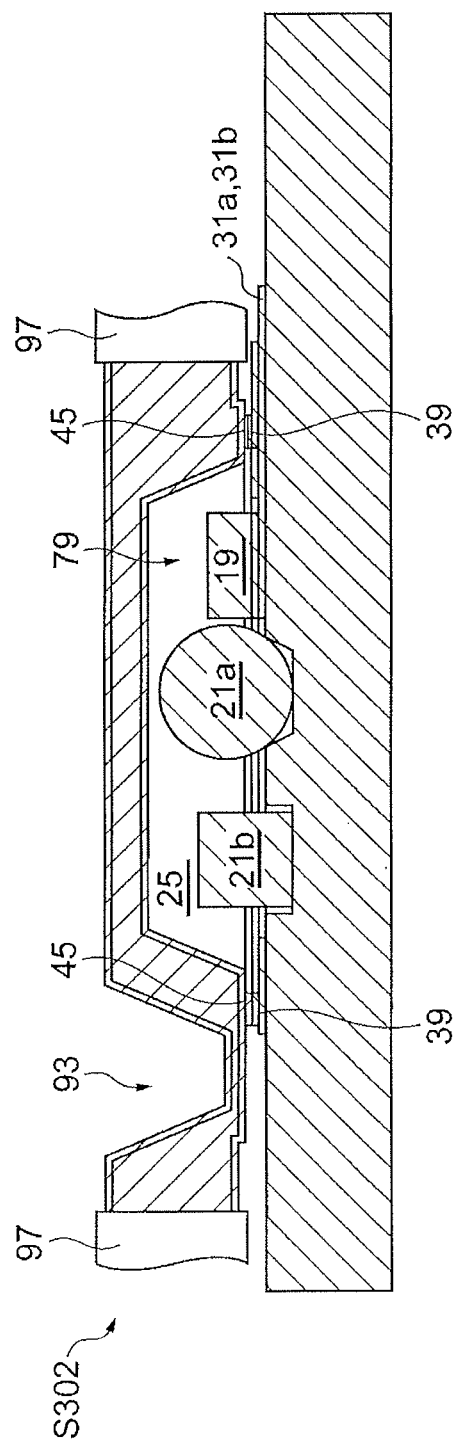

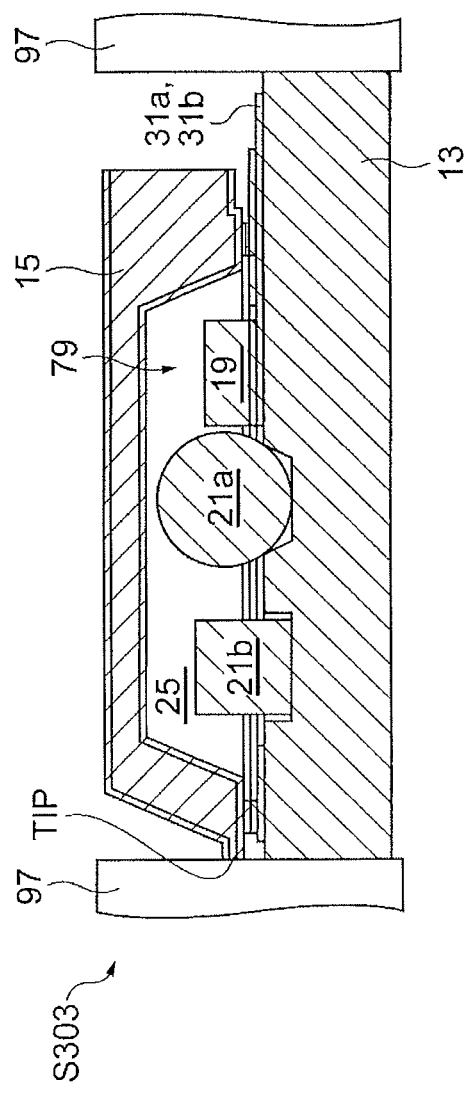

OPTICAL MODULE, METHOD FOR FABRICATING THE SAME

BACKGROUND OF THE INVENTION

Field of the Invention

The present invention relates to an optical module and a method for fabricating an optical module. This application claims the benefit of priority from Japanese Patent application No. 2015-124833 filed on Jun. 22, 2015, which is herein incorporated by reference in its entirety.

Related Background Art

The document referred to by the following URL discloses a compact laser module:
(http://www.semiconwest.org/sites/semiconwest.org/files/docs/SW2013_P.%20De%20Dobbelaere_Luxtera.pdf).

SUMMARY OF THE INVENTION

One aspect of the present invention provides an optical module which includes: a bench part including a bench having a principal surface with first and second areas, a semiconductor optical device disposed on the first area, and a lens disposed on the first area, the first and second areas being arranged in a direction of a first axis; and a cap including a base made of silicon, the cap being disposed on the bench part, the cap having a cavity containing the semiconductor optical device and the lens, the cap including a ceiling extending along a first reference plane, a front wall extending from the ceiling along a second reference plane, and a rear wall extending from the ceiling in a direction from the cap to the bench, the semiconductor optical device, the lens and the cap being arranged along an optical reference plane, and the second reference plane being inclined with respect to the first reference plane making an acute angle.

Another aspect of the present fabricating an optical module. The method includes the steps of: preparing a single-crystalline semiconductor substrate having a first surface and a second surface, the single crystalline semiconductor substrate including an array of sections, and first, second, third, and fourth regions arranged along a first reference plane in each section; forming a first mask on the first surface of the single-crystalline semiconductor substrate, the first mask having an array of first opening patterns; forming an array of inner openings for a cavity on the first surface of the single-crystalline semiconductor substrate by etching with the first mask, the array of inner openings corresponding to the array of first opening patterns; forming a second mask on the second surface of the single-crystalline semiconductor substrate, the second mask having an array of second opening patterns; forming an array of outer openings for a separation in the second surface of the single-crystalline semiconductor substrate by etching with the second mask, the array of outer openings corresponding to the array of second opening patterns; preparing a bench product including a support, a semiconductor optical device, and a lens, the support having a principal surface, the semiconductor optical device being disposed on the principal surface of the support, and the lens being disposed on the principal surface of the support; after forming the inner and outer openings, assembling the bench product and the single-crystalline semiconductor substrate to form an assembly, each inner opening forming a cavity, the cavity containing the semiconductor optical device and the lens of the bench product in the assembly; and forming an optical module by cutting the assembly, each outer opening having a bottom disposed in the first region of the single-crystalline semiconductor substrate, and each inner opening having a bottom disposed in the third region of the single-crystalline semiconductor substrate, each outer opening having a side surface and each inner opening having a side surface, the side surface of the outer opening and the side surface of the inner opening being disposed in the second region, the side surface of the inner opening extending along a first inner reference plane making an acute angle with the first reference plane, the side surface of the outer opening extending along a first outer reference plane making an acute angle with the first reference plane, and the semiconductor optical device of the assembly being optical coupled with the side surface of the inner opening of the cavity through the lens.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIGS. 6A, 6B and 6C are cross sectional views each showing a major step in the method of making the bench product according to the present embodiment.

FIG. 7 is a schematic plan view showing two sections for a bench product in the method of making the bench product according to the present embodiment.

FIGS. 10A, 10B, 10C, and 10D are cross sectional views showing primary steps in the method of making the cap product according to the present embodiment.

FIGS. 11A, 11B, 11C and 11D are cross sectional views each showing a major step in the method of making the cap product according to the present embodiment.

FIG. 12 is a plan view showing a major step in the method of making the cap product according to an embodiment of the present invention.

FIG. 18 is a cross sectional view showing a half-cutting process in the method of fabricating the optical module according to the present embodiment.

FIG. 19 is a cross sectional view showing a full-cutting process in the method of fabricating the optical module according to the present embodiment.

DESCRIPTION OF THE PREFERRED EMBODIMENTS

Figure 1:
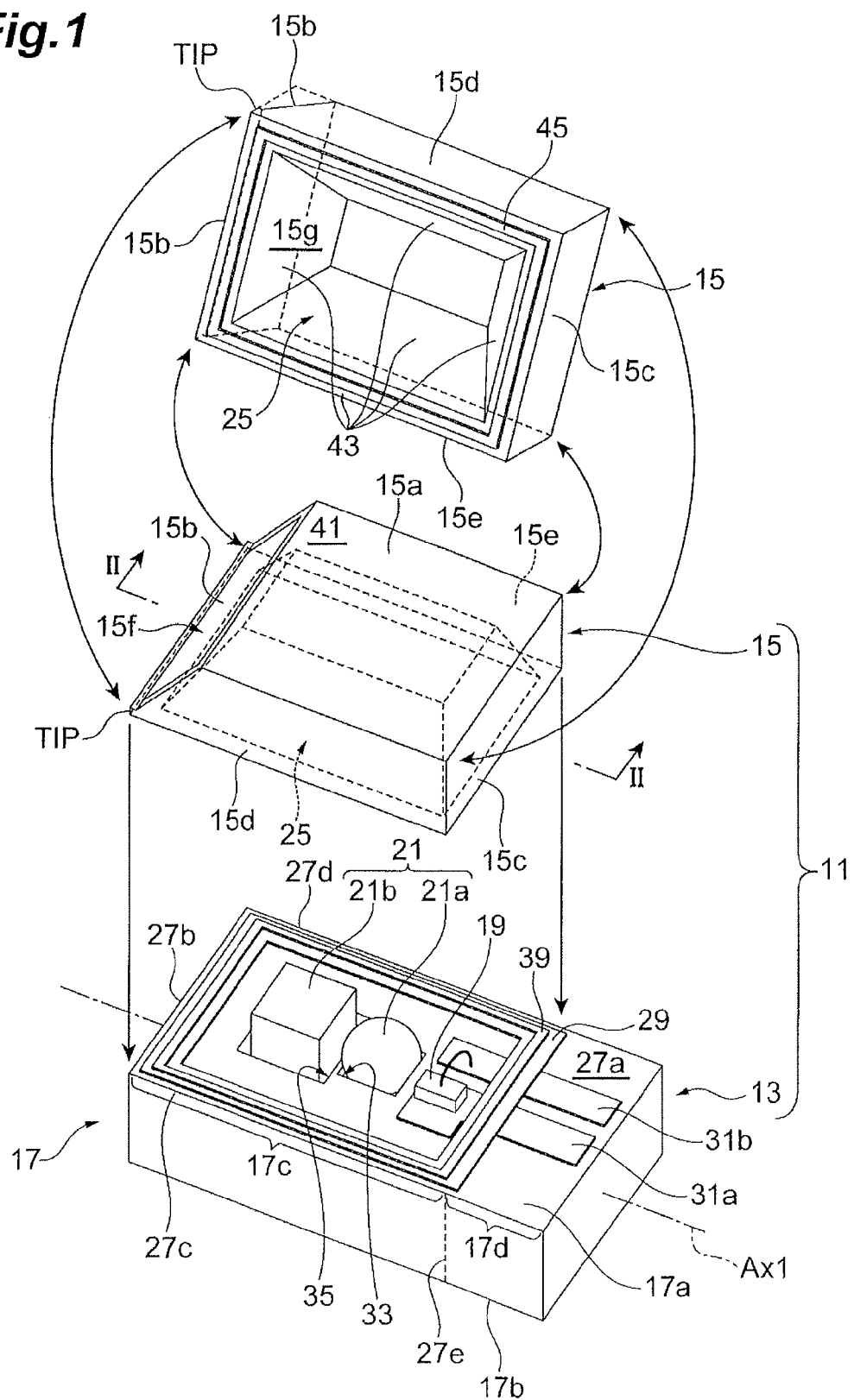
FIG. 1 is a schematic view showing an optical module according to an embodiment of the present invention.

The compact laser module includes a substrate, optical components provided on the substrate (an edge-emitting type semiconductor laser, a lens, and an isolator), and a mirror for reflecting light from the semiconductor laser to the substrate. The laser module is optically coupled to an external device through the bottom face of the substrate in the laser module.

Research conducted by the inventor reveals that optical coupling of the laser module with the external device through the bottom face of the substrate restricts the application of the optical module. The study of the inventor also has found that the application of such an optical module has a potential demand in the form of, for example, an optical module which emits light from an edge-emitting semiconductor laser therein without a reflecting mirror.

It is an object of the present embodiment to provide an optical module that can be optically coupled to an external device through a face different from the bottom face of the substrate of the optical module. It is an object of the present embodiment to provide a method of fabricating an optical module that can be optically coupled to an external device through not the bottom face of the substrate, but a face of the optical module different from the bottom face.

Some specific embodiments according to the above aspects will be described below.

An optical module according to an embodiment of the above aspect includes: a bench part including a bench having a principal surface including first and second areas arranged in a direction of a first axis, and a semiconductor optical device disposed on the first area, and a lens disposed on the first area; and a cap including a base made of silicon, the cap being disposed on the bench part. The cap has a cavity containing the semiconductor optical device and the lens, the cap includes a ceiling extending along a first reference plane, a front wall extending from the ceiling along a second reference plane, and a rear wall extending from the ceiling in a direction from the cap to the bench. The semiconductor optical device, the lens and the cap are arranged along an optical reference plane. The second reference plane is inclined with respect to the first reference plane making an acute angle.

This optical module allows the semiconductor optical device to optically couple to the front wall of the cap through the lens, and this optical coupling allows light of the semiconductor optical device to pass through the front wall of the cap. The light, which the semiconductor optical device emits or receives, is refracted by the inner and outer surfaces of the front wall that extends along the second reference plane. The second reference plane associated with the front wall is inclined with respect to the first reference plane at an acute angle of smaller than 90 degrees to larger than zero degrees. Hence, the inner surface of the front surface, in particular, has a portion extending along the first inner reference plane inclined at an acute angle with respect to the first reference plane, and the outer surface of the front wall, specifically, has a portion extending along the first outer reference plane inclined at an acute angle with respect to the first reference plane. The optical axis of the light associated with the semiconductor optical device passes through the outer point on the outer surface of the front wall and passes through the inner point on the inner surface of the front wall, and the inclination of the front wall heightens the outer point relative to the inner point in the direction normal to the principal surface of the bench. This difference in height makes it possible to distance the outer point, located on the optical axis and the outer front wall, from the tip of the front wall in the normal direction. The production of the cap is likely to form optically non-uniform shape at the tip of the front wall of the cap, but the inclination of the front wall can prevent the non-uniform shape of the tip from disturbing the light that is associated with the semiconductor optical device and passes through the front wall The optical module according to an embodiment of the above aspect further includes an optical isolator disposed on the first area of the bench. The semiconductor optical device includes a laser diode.

This optical module can prevent light returning from the outside of the optical module from reaching the semiconductor laser.

In the optical module according to an embodiment of the above aspect, the bench includes a base made of silicon, and the base of the bench includes an electrode mounting the semiconductor optical device thereon, and a recess positioning the lens.

This optical module has a structure allowing the formation of the positioning recess and the electrode in the silicon base.

A method for fabricating an optical module according an embodiment of the above aspect, includes the steps of: preparing a single-crystalline semiconductor substrate having a first surface and a second surface, the single crystalline semiconductor substrate including an array of sections, and first, second, third, and fourth regions arranged along a first reference plane in each section; forming a first mask on the first surface of the single-crystalline semiconductor substrate, the first mask having an array of first opening patterns; forming an array of inner openings for a cavity on the first surface of the single-crystalline semiconductor substrate by etching with the first mask, the array of inner openings corresponding to the array of first opening patterns; forming a second mask on the second surface of the single-crystalline semiconductor substrate, the second mask having an array of second opening patterns; forming an array of outer openings for a separation on the second surface of the single-crystalline semiconductor substrate by etching with the second mask, the array of outer openings corresponding to the array of second opening patterns; preparing a bench product including a support, a semiconductor optical device, and a lens, the support having a principal surface, the semiconductor optical device being disposed on the principal surface of the support, and the lens being disposed on the principal surface of the support; after forming the inner and outer openings, assembling the bench product and the single-crystalline semiconductor substrate to form an assembly, each inner opening forming a cavity, the cavity containing the semiconductor optical device and the lens of the bench product in the assembly; and forming an optical module by cutting the assembly. Each outer opening has a bottom disposed in the first region of the single-crystalline semiconductor substrate, and each inner opening has a bottom disposed in the third region of the single-crystalline semiconductor substrate. Each outer opening has a side surface and each inner opening has a side surface, and the side surface of the outer opening and the side surface of the inner opening are disposed in the second region. The side surface of the inner opening extends along a first inner reference plane making an acute angle with the first reference plane, and the side surface of the outer opening extends along a first outer reference plane making an acute angle with the first reference plane. The semiconductor optical device of the assembly is optically coupled with the side surface of the inner opening of the cavity through the lens.

The method of fabricating an optical module forms, on the second surface, the separating outer opening having the bottom surface in the first region of the single crystal semiconductor substrate, and forms, on the first surface, the inner opening for the cavity having the bottom surface in the third region of the single-crystal silicon substrate. The side surface of the outer opening and the side surface of the inner opening are located in the second region of the single crystal semiconductor substrate. The sides of the inner opening and the outer opening extend along the first inner reference plane and the first outer reference plane, respectively, and the first inner reference plane and the first outer reference plane form respective acute angles with the first reference plane. Light passing through the one side of the inner opening and the one side of the outer opening is refracted by each of the sides of the inner and outer openings, and the optical axis of the light associated with the semiconductor optical device passes through the outer point on the outer surface of the front wall and passes through the inner point on the inner surface of the front wall, and the inclination of the front wall heightens the outer point relative to the inner point in the direction from the first surface of the single crystal semiconductor substrate to the second surface. This difference in height makes it possible to distance the outer point, located on the optical axis and the outer front surface, from the tip of the front wall in the direction normal to the principal surface of the bench. The production of the cap is likely to form an optically non-uniform shape at the tip of the front wall of the cap, and the inclination of the front wall can prevent the thus formed tip with the non-uniform shape from disturbing the light that is associated with the semiconductor optical device and passes through the front wall.

In the method according to an embodiment of the above aspect, the bench product includes an array of sections corresponding to the array of the section in the single-crystalline semiconductor substrate, and the semiconductor optical device and the lens is disposed in each section of the bench product.

The method of fabricating an optical module can fabricate a plurality of optical modules together.

In the method according an embodiment of the above aspect, the step of forming an optical module includes cutting the single-crystalline semiconductor substrate in the fourth region thereof.

The method of fabricating an optical module includes a process of forming a portion for the rear wall of the cap in the optical module.

In the method according to an embodiment of the above aspect, the step of forming an optical module includes bonding the first surface of the single-crystalline semiconductor substrate and the principal surface of the bench product to each other, and after bonding the first surface of the single-crystalline semiconductor substrate and the principal surface of the bench product, cutting the single-crystalline semiconductor substrate and the bench product at a position of the outer opening.

The fabricating method can provide an optical module including a bench part including the semiconductor optical device and the lens, and a cap having a base made of silicon, and the lens being provided on the bench part.

Teachings of the present invention can be readily understood by considering the following detailed description with reference to the accompanying drawings shown as examples. Referring to the accompanying drawings, embodiments of the present invention according to an optical module and a method of producing an optical module will be described. If possible, the same portions will be denoted by the same reference symbols.

Figure 2:
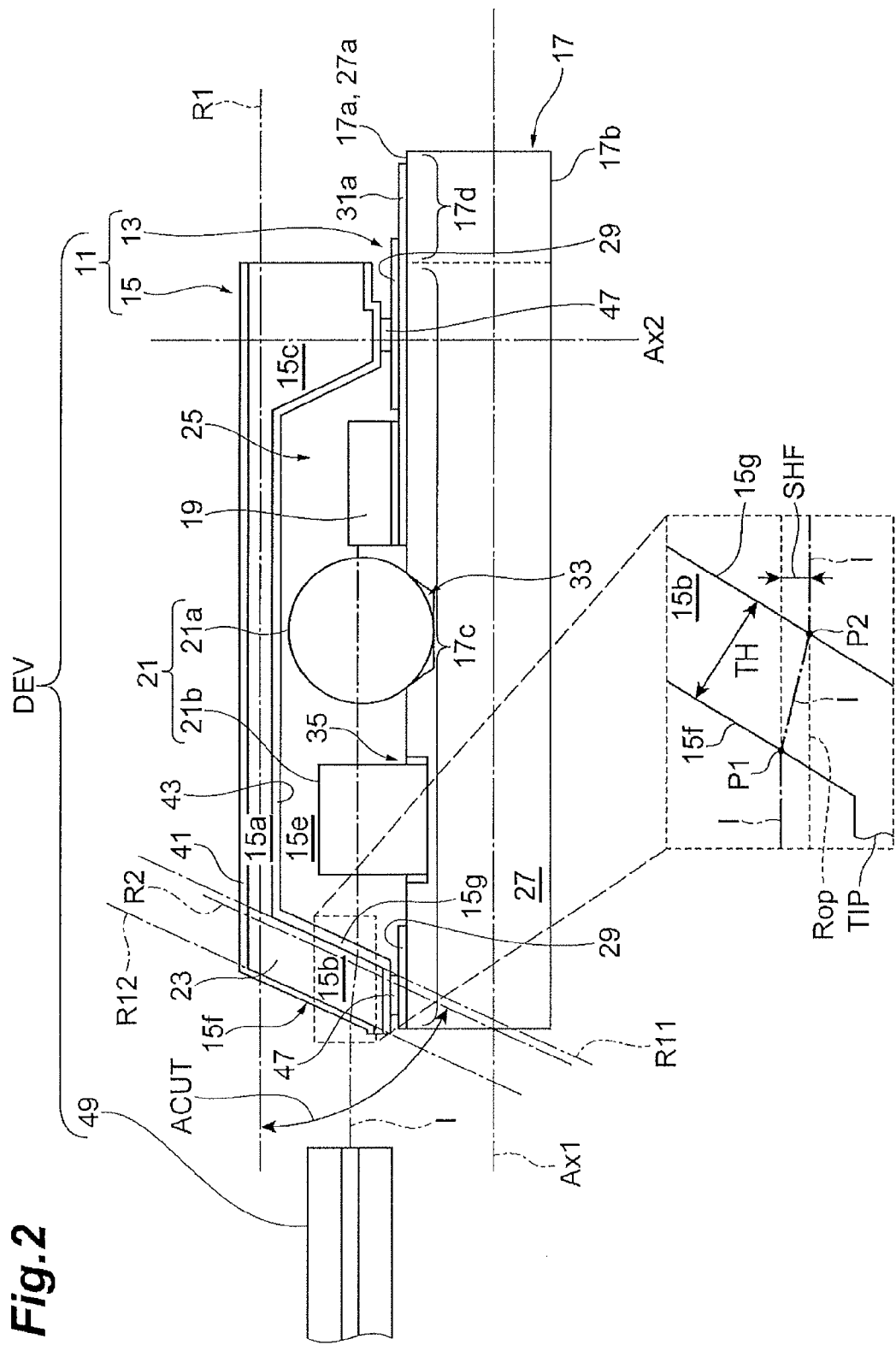
FIG. 2 is a cross sectional view taken along the line II-II shown in FIG. 1.
Figure 3:
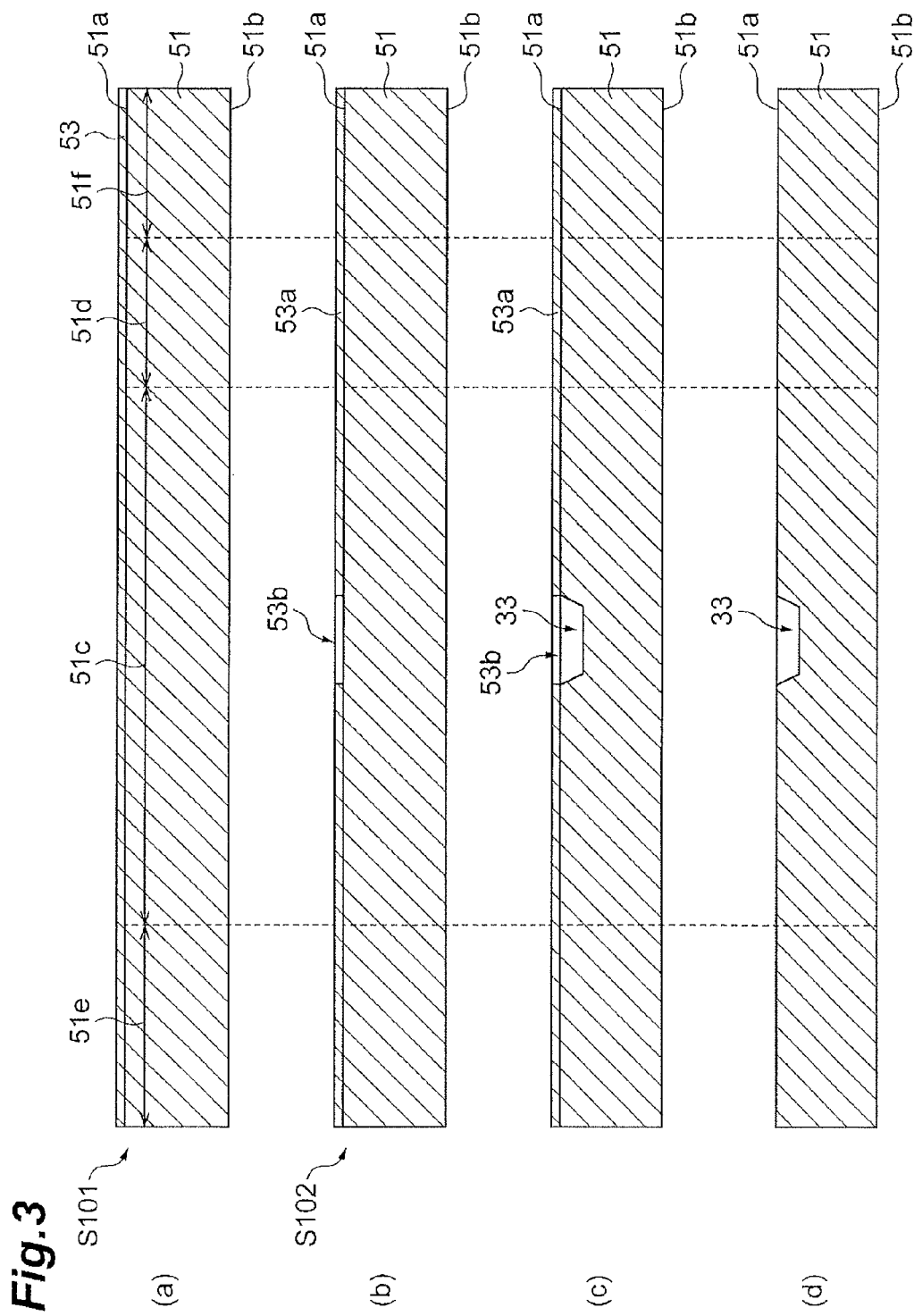
FIG. 3 is a cross sectional view, taken along a line corresponding to the cross-sectional view shown in FIG. 2, schematically showing primary steps in the method of making a bench product for a bench part.

FIG. 1 is a schematic view showing an optical module according to the present embodiment. FIG. 2 is a longitudinal sectional view taken along the line II-II shown in FIG. 1. An optical module 11 includes a bench part 13 and a cap 15. The cap 15 is provided on the bench part 13, and has a silicon base 23. The bench part 13 has a bench 17 and a semiconductor optical device 19, and if necessary, the bench part 13 may further include an optical component 21. The optical component 21 includes a lens 21a, and may include an optical isolator 21b. The semiconductor optical device 19 encompasses, for example, a laser diode, and a photodiode. The bench 17 has a principal surface 17a and a back surface 17b, and the back surface 17b is opposite to the principal surface 17a. The principal surface 17a includes a first area 17c and a second area 17d, which are arranged in the direction of a first axis Ax1. The semiconductor optical device 19 and the optical component 21 are disposed on the first area 17c.

The cap 15 includes a cavity 25 which contains the semiconductor optical device 19 and the optical component 21 therein. The cap 15 includes a ceiling 15a, a front wall 15b, and a rear wall 15c. The front wall 15b of the cap 15 is optically coupled to the semiconductor optical device 19 through the optical component 21, such as, a lens 21a. A light beam I associated with the semiconductor optical device 19 (light the semiconductor optical device 19 receives or light the semiconductor optical device 19 emits) can pass through the front wall 15b of the cap 15. More specifically, as shown in FIG. 2, the ceiling 15a extends along the first reference plane R1. The front wall 15b extends from the ceiling 15a along the second reference plane R2. The rear wall 15c extends from the ceiling 15a in a direction from the cap 15 toward the bench part 13 (the direction of the second axis Ax2 intersecting the first axis Ax1). The second reference surface R2 is inclined with respect to the first reference plane R1 at an acute angle ACUT. The acute angle ACUT is smaller than 90 degrees and larger than zero degrees. In the outer surface 15f and the inner surface 15g of the front wall 15b (specifically, an outer surface and an inner surface of the base 23 corresponding the outer surface 15f and the inner surface 15g of the front wall 15b, respectively) including a (111) surface of silicon-based material of the base, the acute angle ACUT is, for example, 54.7 degrees. In this embodiment, the front wall 15b of the cap 15, the semiconductor optical device 19 and the optical component 21 are arranged on the first area 17c along an optical reference plane Rop. The front wall 15b of the cap 15 is inclined with respect to the optical reference plane Rop. This inclination allows the optical beam I, associated with the semiconductor optical device 19, to be refracted twice, i.e., at times at which the beam is incident on and is emitted from the wall 15b, so that these refractions change the traveling direction of the optical beam I twice, and the light beam propagates at the first level of the plane Rop and the second level that deviates from the plane Rop. The inclination angle of the front wall 15b is an acute angle, rather than a right angle, with respect to the optical reference plane Rop.

In the present embodiment, the cap 15 includes a first side wall 15d and a second side wall 15e, which extend in the direction of the first axis Ax1. Specifically, the first and second side walls 15d and 15e are connected to one end and the other end of the front wall 15b and to one end and the other end of the rear wall 15c, respectively. The upper end of the front wall 15b, the upper end of the rear wall 15c, the upper end of the second side wall 15e, and the upper end of the first side wall 15d are connected to the ceiling 15a, and these connections allow the arrangement of the ceiling 15a, the front wall 15b, the rear wall 15c, the first side wall 15d and the second side wall 15e to form a cavity 25.

In the optical module 11, the semiconductor optical device 19, lens 21a, and the front wall 15b of the cap 15 are arranged along the optical reference plane Rop, such that the semiconductor optical device 19 is coupled through the optical component 21, such as a lens 21a, to the front wall 15b of the cap 15. The light beam I associated with the semiconductor optical device 19 can pass through the front wall 15b of the cap 15, and the light beam I from or to the semiconductor optical device 19 is refracted by the inner surface 15g and the outer surface 15f of the front wall 15b, which extends along the second reference plane R2. The second reference plane R2, which is associated with the front wall 15b, is inclined at an acute angle of less than 90 degrees and larger than zero degrees with respect to the first reference plane R1 and the optical reference plane Rop. Hence, the inner surface 15g of the front wall 15b has a part extending along a first inner reference plane R11 which is inclined with respect to the first reference surface R1, in particular, at an acute angle ACUT, and the outer surface 15f of the front wall 15b has a part extending along a first outer reference plane R12 which is inclined with respect to the first reference plane R1 and the optical reference plane Rop, in particular, at an acute angle. The optical axis of the light beam L passes through an outer point on the outer surface 15f of the front wall 15b and an inner point on the inner surface 15g of the front wall 15b, and the inclination of the front wall 15b heightens the outer point relative to the inner point in the direction normal to the principal surface 17a of the bench 17. This difference in height makes it possible to distance the outer point P1, located on the optical axis and the outer front surface 15f, from the tip TIP of the front wall 15b in the normal direction. The production of the cap 15 is likely to provide the tip TIP of the front wall 15b with an optically non-uniform shape, but the inclination of the front wall 15b allows the tip TIP of the non-uniform shape not to disturb the light beam L that is associated with the semiconductor optical device 19 and passes through the front wall 15b.

Further, the thickness of the front wall 15b causes the inclined surface in the outer surface 15f of the front wall 15b to terminate far from the principal surface 17a of the bench 17 in the direction of the normal axis, as compared with the end of the inner surface 15g. In contrast, the inclined surface in the inner surface 15g of the front wall 15b extends toward the principal surface 17a of the bench 17 to terminate closer to the principal surface 17a as compared to that of the outer surface 15f. This level difference between the respective terminations (difference in the height of the lower ends) of these inclined surfaces is related to the inclination and thickness of the front wall 15b, and is inevitable in the structure of the cap 15. The light beam I associated with the semiconductor optical device 19 propagates through the optical components 21, which are arranged on the principal surface 17a of the bench 17, and the optical path of the light I is located near the principal surface 17a of the bench 17. The front wall 15b has a desired thickness and a desired slope, and can refracts a light beam propagating through the wall 15b to allow the entering level and the emitting level of the propagating light beam on the respective surfaces of the front wall 15b to differentiate from each other.

The lens 21a and the optical isolator 21b are fixed to the bench 17 by, for example, an epoxy-based adhesive. The semiconductor optical device 19 is bonded to the bench 17 by, for example, a solder material (AuSn solder). The lens 21a is used for condensing the light beam associated with the semiconductor optical device 19.

The bench 17 includes a base 27 made of silicon, and electrodes 31a and 31b disposed on the principal surface 27a of the base 27, and the electrodes 31a and 31b are connected to the semiconductor optical device 19. The principal surface 17a of the bench 17 has a first recess 33 for positioning the lens 21a, such as ball lens, and a second recess 35 for receiving the optical isolator 21b. The first and second recesses 33 and 35 are produced by processing silicon of the base 27. On the principal surface 27a of the base 27, the electrodes 31a and 31b extend across the boundary between the first area 17c and the second area 17d in s direction from the first area 17c to the second area 17d. The insulating layer 29 for insulation and hermetic seal is provided along a front edge 27b, a first side edge 27c and a second side edge 27d of the base 27, and on the boundary 27e between the first area 17c and the second area 17d. The insulating layer 29 may be made of a silicon-based inorganic insulating film, such as $SiO_2$, SiN, and SiON. The insulating layer 29 has a closed stripe extending along a closed loop on the principal surface 27a of base 27. On the insulating layer 29, the lower metal layer 39 is provided for hermetic sealing, and also has a strip shape along a closed loop in the principal surface 27a of the base 27. The insulating layer 29 extends over the electrodes 31a and 31b, and the lower metal layer 39 is provided on the insulating layer 29, so that the insulating layer 29 can electrically isolate the electrodes 31a and 31b from the lower metal layer 39.

The cap 15 has a base 23 made of silicon. As shown in FIG. 2, the outer surface of the base 23 of the ceiling 15a and the outer surface of the front wall 15b are covered with an outer protective film 41 except for the front end TIP of the front wall 15b of the cap 15, the outer surface of the rear wall 15c, an outer surface of the first side wall 15d, and an outer surface of the second side wall 15e (which are cutting surfaces). In addition, the inner surface of the base 23 of the ceiling 15a (the ceiling surface of the cavity), the inner surface and the lower end surface of the base 23 of the front wall 15b (the front surface of the cavity), the inner surface and the lower end surface of the base 23 of the rear wall 15c (the rear surface of the cavity), the inner surface and the lower end surface of the base 23 of the first side wall 15d (the side surface of the cavity), and the inner surface and the lower end surface of the base 23 of the second side wall 15e (the side surface of the cavity) are covered with an inner protective film 43. It is preferable that the outer protective layer 41 and the inner protective layer 43 each comprise a dielectric film, which acts as an antireflection film, disposed on a silicon base. The antireflection film can reduce optical loss of an incident light beam through the walls 15b.

The upper metal layer 45 is provided for hermetic sealing on the inner protective layer 43 covering the lower end surface of the base 23 of the front wall 15b of the cap 15, the lower end surface of the base 23 of the rear wall 15c, the lower end surface of the base 23 of the first side wall 15d, and the lower end face of the base 23 of the second side wall 15e. The upper metal layer 45 also has a stripe shape extending along a closed loop on the above lower end surfaces of the base 23.

In the cap 15 of the base 23 made of silicon single crystal, the inner surface of the base 23 of the front wall 15b, the inner surface of the base 23 of the rear wall 15c, and the inner surfaces of the base 23 of the first and second side walls 15d and 15e may include a (111) plane of silicon. This structure can be fabricated using a silicon substrate having, for example, a principal surface of (001) plane.

In needed, the upper metal layer 45 of the cap 15 and the lower metal layer 39 of the bench part 13 can be bonded to each other through the metal body 47, such as a solder material, to hermetically seal the cavity 25 of the assembly the cap 15.

The present embodiment described above can provide the optical light module optically connectable through the side face thereof, not the back surface of the substrate.

Major steps in a method for producing an optical module 11 will be described below. Where possible, the reference numerals used in the description of the optical module 11 with reference to FIGS. 1 and 2 are used in order to facilitate understanding of the subsequent description of the fabrication method. A process of preparing a bench product for the bench part 13 will be explained below with reference to FIGS. 3, 4, 5, FIGS. 6A, 6B and 6C, and FIG. 7, which show respective cross-sectional views corresponding to the cross sectional view in FIG. 2. As can be seen from the subsequent description, the preparing process can be, for example, to fabricate a bench product.

In step S101, a single-crystal semiconductor substrate, such as a silicon wafer 51, is prepared. The silicon wafer 51 has a principal surface 51a and a back surface 51b, and the principal surface 51a may include, for example, (001) plane. The silicon wafer 51 has a size which can provide an array of sections (each of which is used to produce a single bench 17) thereon (e.g., the size of the section is about 3 mm×4 mm, the silicon wafer has a size of six inches), and has for example, a thickness of 725 μm. In each section in the array, the principal surface 51a has a first area 51c, a second area 51d, a third area 51e and a fourth area 51f. The third area 51e and the fourth area 51f is a margin provided for separation. As shown in Part (a) of FIG. 3, a first insulating film 53, such as silicon oxide film, is formed on the principal surface 51a of the silicon wafer 51. In this embodiment, an insulating film is not prepared to cover the back surface 51b of the silicon wafer 51, and if needed, such an insulation film may be formed on the back surface 51b.

In step S102, a recess, which works as the first recess 33 for placing the lens 21a in the present embodiment, is formed in the first area 51c of each section of the silicon wafer 51. As shown in Part (b) of FIG. 3, a first mask 53a which defines the first recess 33 for the lens 21a to be disposed thereat is formed of the first insulating film 53 using photolithography. As shown in Part (c) of FIG. 3, the silicon single crystal that is exposed at the first opening 53b of the first mask 53a is wet-etched, using KOH solution acting as an etchant, with a first mask 53a to form the recess 33 in the first area 51c. Because of the four-fold symmetry of silicon, the shape of the first opening 53b may be, for example, a rectangular or square, and in this embodiment, is a square that includes a pair of sides extending the <110>-axis direction of the silicon crystal and a pair of sides extending in the <11-0>-axis direction. After forming the first recess 33, as shown in Part (d) of FIG. 3, the first mask 53a is removed.

Figure 4:
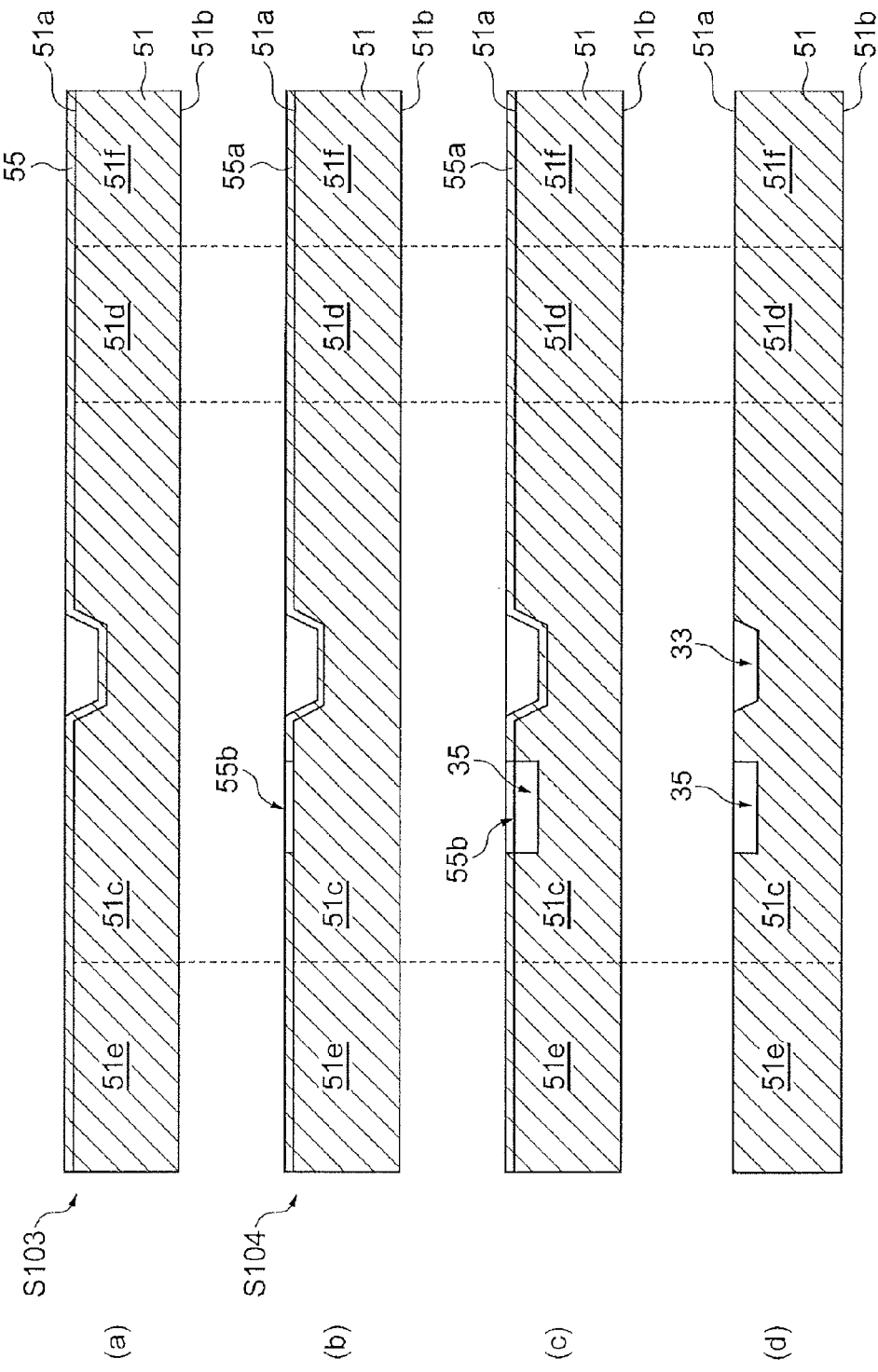
FIG. 4 is a cross sectional view showing major steps in the method of making the bench product according to the present embodiment.

After removing the first mask 53a, in step S103, as shown in Part (a) of FIG. 4, a second insulating film 55, such as silicon oxide film, is formed on the principal surface 51a of the silicon wafer 51. In order to avoid etching of the back surface 51b of the silicon wafer 51, an insulating film, such as silicon oxide film, may be formed on the back surface 51b.

In step S104, a recess, which works as the second recess 35 in which the optical isolator 21b is placed in this embodiment, is formed in the first area 51c of each section of the silicon wafer 51. As shown in Part (b) of FIG. 4, a second mask 55a, defining the second recess 35 in which the optical isolator 21b is placed, is formed of the second insulating film 55 using photolithography. As shown in Part (c) of FIG. 4, the single-crystal silicon that is exposed with the second mask 55a at the second opening 55b of the second mask 55a is dry-etched to form the second recess 35 next to the first recess 33. The shape of the second opening 55b may be, for example, a square or rectangular, and in this embodiment, is a square which includes a pair of sides extending in the <110> axis direction of the silicon crystal and a pair of sides extending in the <11-0> axis direction. After forming the second recess 35 in the first area 51c, as shown in Part (d) of FIG. 4, the second mask 55a is removed.

Figure 5:
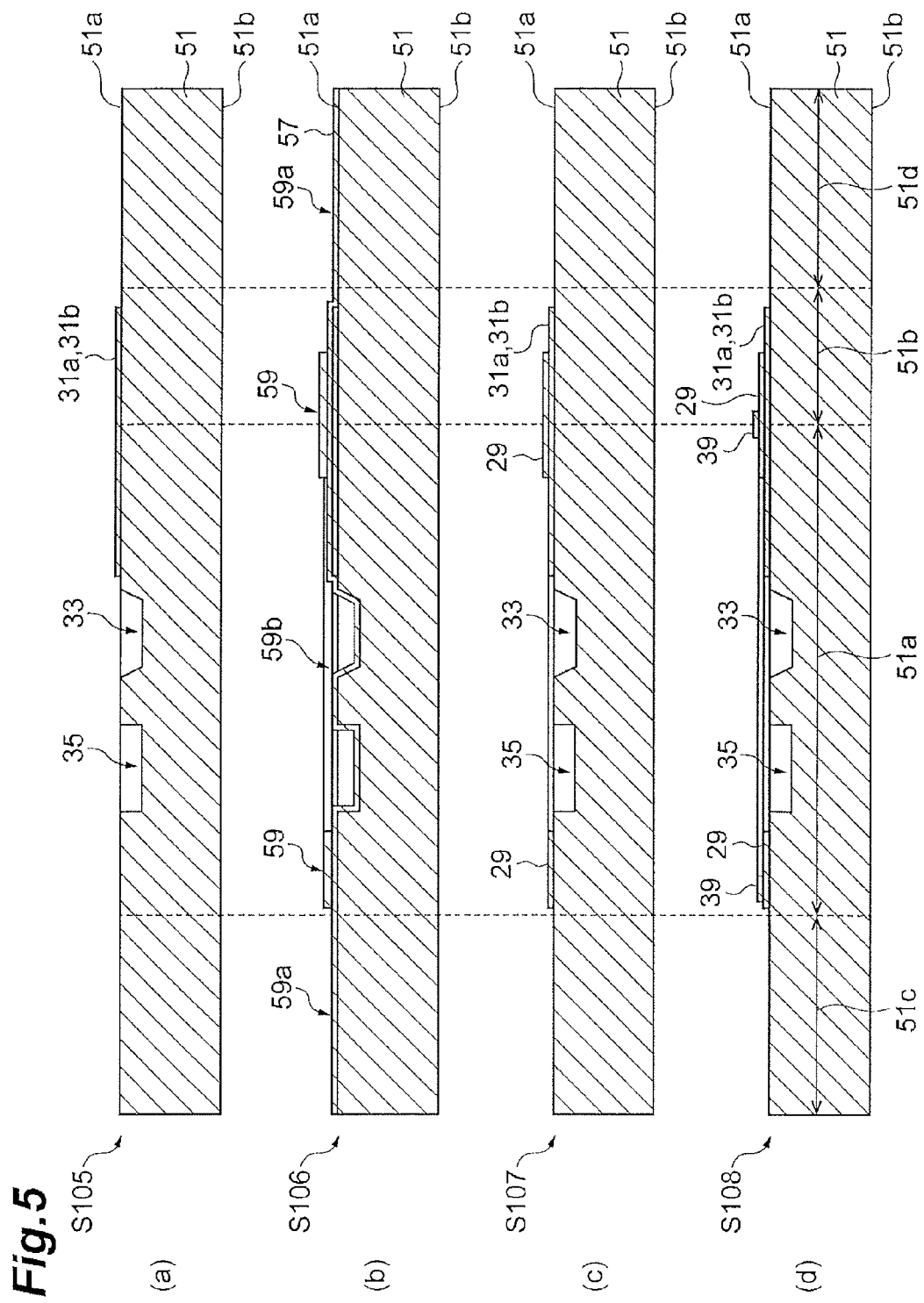
FIG. 5 is a cross sectional view showing major steps in the method of making the bench product according to the present embodiment.

In step S105, as shown in Part (a) FIG. 5, the electrodes 31a and 31b are formed on the first area 51c and the second area 51d. In the present embodiment, the electrode 31a and 31b are formed by a lift-off method. Specifically, after forming a sacrificial layer having a pattern for lift-off, a metal film is grown thereon by vapor deposition. The sacrificial layer may be a resist film, and the metal film may include, for example, a Ti/Pt/Au (100 nm/200 nm/500 nm). After the growth of the metal film, the silicon wafer 51 is immersed in a remover for the sacrificial layer to carry out a lift-off of the metal film.

In step S106, an insulating layer 29 for insulation and hermetic sealing is formed thereon. As shown in Part (b) of FIG. 5, an insulating film 57 (e.g., Si$_3$N$_4$ of 500 nm thick) is formed for the insulating layer 29 by chemical vapor deposition (CVD) method. A third mask 59 having a sealing pattern is formed on the insulating film 57 using photolithography. Part (b) of FIG. 5 is a cross-sectional view showing a first opening 59a and a second opening 59b of the third mask 59, and the third mask 59 has a closed stripe pattern for sealing which defines the shape of the insulating layer 29 in each section.

In step S107, as shown in Part (c) of FIG. 5, the application of the dry etching with the third mask 59 using an etchant (CF$_4$) to the insulating film 57 can form the insulating layer 29 on the first area and the boundary between the first area and the second area, and after the etching, the third mask 59 is removed by a remover.

In step S108, as shown in Part (d) of FIG. 5, a sealing member is formed. The sealing member may include, for example, a metal member and an organic resin. In the present embodiment, the sealing member comprising a metallic material is formed. Specifically, the lower metal layer 39 for hermetic sealing is formed by a lift-off method. More specifically, after forming a sacrificial layer having a pattern for lift-off, a metal film is grown by vapor deposition. The sacrificial layer may be a resist film, and the metal film made of, for example, a Ti/Pt/Au (100 nm/200 nm/50 nm), is grown thereon. After depositing the metal film, the silicon wafer 51 is immersed in a remover solution for the sacrificial layer to carry out a lift-off of the metal film. This process can form a patterned metal film, for example, the lower metal layer 39 on the insulating layer 29 of each section in this embodiment.

In step S109, the semiconductor optical device 19 is die-bonded thereon. As shown in FIG. 6A, a solder 61 for die bonding of the semiconductor optical device 19 is formed by a lift-off method. More specifically, after forming a sacrificial layer having a pattern for lift-off, a metal film is grown by vapor deposition. The sacrificial layer may be a resist film, and the metal film is formed by depositing, for example, a AuSn solder with a thickness of two micrometers. After forming the metal film, the silicon wafer 51 is immersed in a remover solution for the sacrificial layer to carry out a lift-off of the metal film. Then, as shown in FIG. 6B, the die bonding of the semiconductor optical device 19 is carried out thereon. Specifically, a laser diode is disposed on the bonding solder and fixed by soldering. The work temperature is, for example, 330 degrees Celsius. After the die-bonding of the semiconductor optical device 19, the upper electrode of the semiconductor optical device 19 is wired to the electrode 31b through a gold wire 63.

At step S110, as shown in FIGS. 7 and 6C, the optical part 21 is disposed in each section. In this embodiment, a ball lens and an isolator are secured to the first recess 33 and second recess 35, respectively. In order to secure the lens and the isolator, an adhesive member 65, such as epoxy adhesive, can be used. FIG. 6C shows a cross-section taken along VIc-VIc line shown in FIG. 7.

These steps prepare a bench product SPBN comprising an array of sections each of which is formed for the bench part 13. FIG. 7 is a schematic plan view showing an area for typical two sections in step S110. The bench product SPBN comprises a silicon wafer 51 to which the above processing has been applied, and the silicon wafer 51 acts as a support on the principal surface of which the semiconductor optical device 19 and the optical part 21 mount for each section. Further, the bench product SPBN has a structure for hermetic sealing.

The subsequent explanation is given on a step of preparing a cap product for the cap 15 with reference to FIGS. 8A, 8B, 8C and 8D, FIG. 9, FIGS. 10A, 10B, 10C, and 10D, FIGS. 11A, 11B, 11C and 11D, FIG. 12, FIG. 13, FIGS. 14A and 14B, and FIG. 15, which show respective cross sections corresponding to the cross-section shown in FIG. 2. As will be understood from the subsequent description, in order to prepare a cap product, producing the cap product is carried out as an example of the preparation.

Figure 8A:
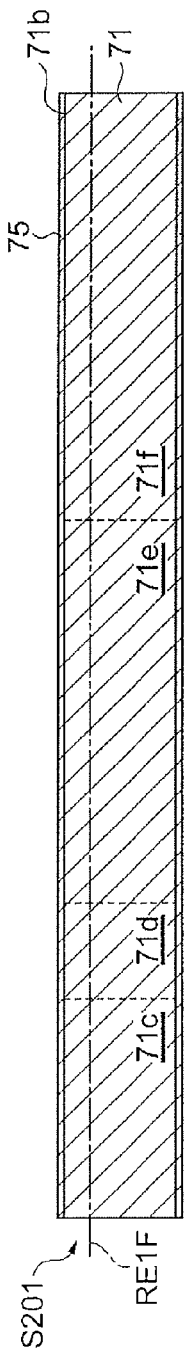
FIGS. 8A, 8B, 8C and 8D are cross sectional views, each showing a major step in a method of making a cap product for the cap, taken along a line corresponding to the cross-section shown in FIG. 2.

In step S201, as shown in FIG. 8A, a silicon wafer 71 is prepared as a single crystal semiconductor substrate. The silicon wafer 71 has a first face 71a and second face 71b, and the first and second faces 71a and 71b of the silicon wafer 71 are preferably parallel to each other. In the present embodiment, each of the first face 71a and the second face 71b is provided with a (001) plane. The thickness thereof can be, for example, 725 μm. Each of the first and second faces 71a and 71b may have, for example, an off-angle in a range of −1 to +1 degree with respect to the (001) plane. The first face 71a is opposite to the second face 71b. The silicon wafer 71 may include an array of sections (each of which is prepared as a base 23 for the single cap), and has a size (for example, each section can be provided with a size of 3 mm×4 mm, and the silicon wafer can be provided with a size of 6 inches) which allows the wafer to be provided with the array. The silicon wafer 71 for the single-crystal semiconductor substrate includes a first region 71c, a second region 71d, a third region 71e and a fourth region 71f for each section in the array. A third insulating film 73 and a fourth insulating film 75 are formed on the first surface 71a and the second surface 71b of the silicon wafer 71, respectively. Each of the third insulating film 73 and the fourth insulating film 75 may include, for example, a silicon oxide film.

An array of inner openings is formed in the first surface 71a of the silicon wafer 71, and an array of external openings is formed on the second surface 71b of the silicon wafer 71. In the present embodiment, the inner openings are formed and thereafter the external openings are formed, but the external openings can be formed and thereafter the inner openings can be formed.

Figure 8B:
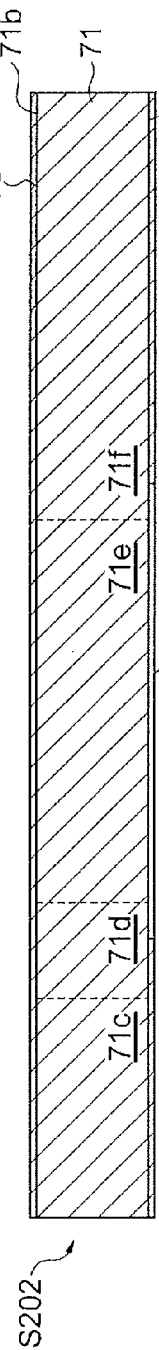
Figure 8C:
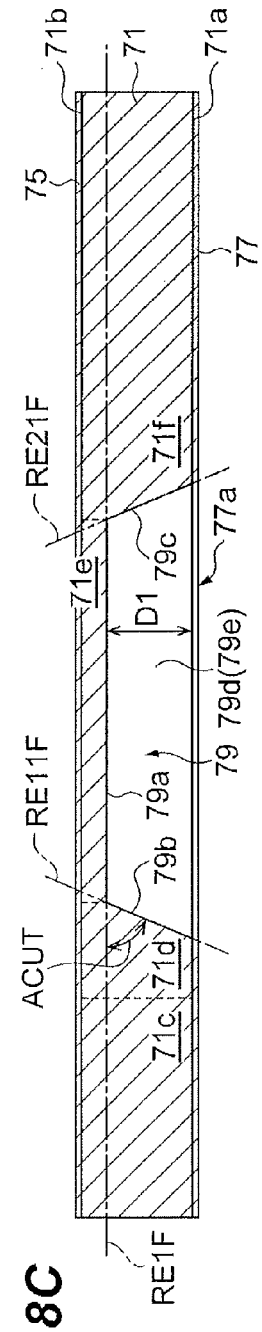
Figure 9:
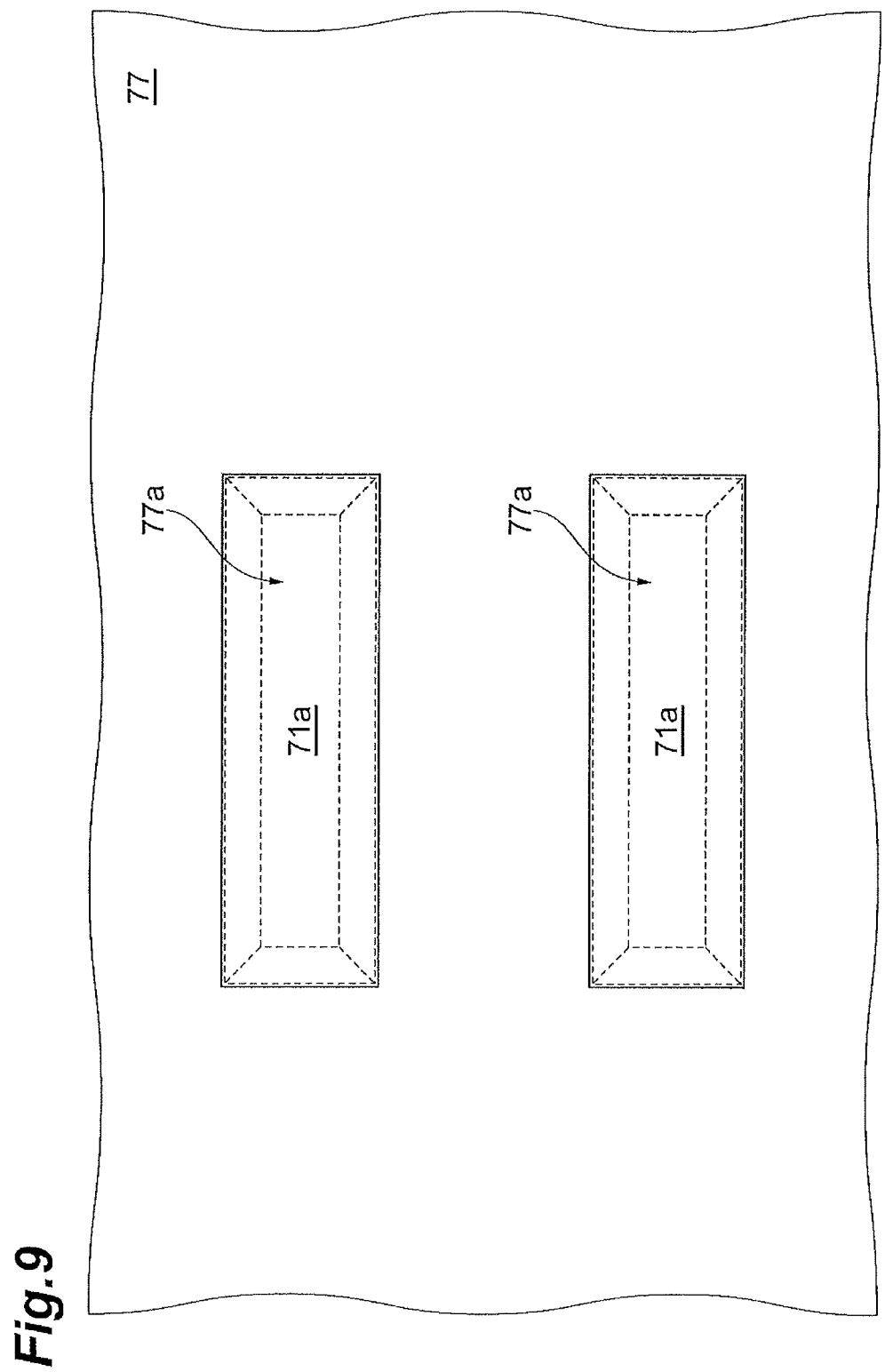
FIG. 9 is a drawing showing a major step in the method of making the cap product according to the present embodiment.

In step S202, the internal opening for the cavity 25 of the cap 15 is formed in the second area 71d, the third region 71e and the fourth region 71f in each section of the array on the silicon wafer 71. As shown in FIG. 8B, a third mask 77 is formed from the third insulating film 73 on the first surface 71a using photolithography. The third mask 77 has a first opening pattern 77a for internal openings each of which defines the cavity 25. FIG. 9 is a view showing the third mask 77 formed on the first face 71a of the silicon wafer 71. In FIG. 9, a broken line drawn on the inside of the first opening pattern 77a indicates the shape of the inner opening to be formed, and the first opening pattern 77a has a stripe shape which extends in one of <110> and <11-0> axial directions and is located in the section, and specifically, the shape of the first opening pattern 77a can be a rectangle provided for the section. In this embodiment, the first opening pattern 77a can be, for example, a rectangular with one pair of sides extending in the <110> axial direction of a silicon crystal and the other pair of sides extending in the <11-0> axial direction. As shown in FIG. 8C, the single-crystal silicon exposed in the first opening pattern 77a of the third mask 77 is etched with the third mask 77 using KOH solution as an etchant to form the inner opening 79. The inner opening 79 has a bottom surface 79a, a front inner surface 79b and a rear inner surface 79c. The bottom surface 79a extends along the first reference plane RE1F. The first region 71c, the second region 71d, the third region 71e and the fourth region 71f are arranged in order along the first reference plane RE1F in each of the sections. The bottom surface 79a of the inner opening 79 is provided in the third region 71e, the front inner surface 79b of the inner opening 79 is provided in the second region 71d, and the inner surface 79c of the inner opening 79 is provided in the fourth region 71f. The front inner surface 79b of the inner opening 79 extends along the first inner reference plane RE11F that is inclined at an acute angle ACUT with respect to the first reference plane RE1F, and the inner surface 79c of the inner openings 79 extends along the second inner reference plane RE21F that is inclined at an acute angle with respect to the first reference plane RE1F, so that the cross-section of the inner opening 79 is provided with a trapezoidal. The inner opening 79 includes one side 79d and the other side 79e that will become the inner surfaces of the side walls of the cap. The side 79d connects one edge of the front inner surface 79b to one edge of the rear inner surface 79c, and the other side 79e connects the other edge of the front inner surface 79b to the other edge of the rear inner surface 79c. The front inner surface 79b and the rear inner surface 79c of the inner opening 79 each include, for example, silicon (111) plane, and the bottom surface 79a includes a (001) plane of silicon.

Figure 8D:
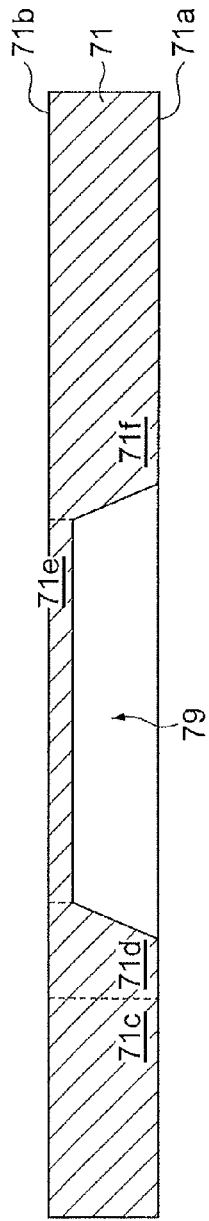

The first depth D1 of the inner opening 79 (for example, the level difference between the bottom surface 79a and the first surface 71a) is defined with respect to the first surface 71a, and can be, for example 550 micrometers, and in a range of 400 to 650 micrometers. As shown in FIG. 8D, the third mask 77 and the third insulating film 73 are removed after forming the inner opening 79.

At step S203, after removing the third mask 77, as shown in FIG. 10A, the fifth insulating film 81, such as silicon oxide film, is formed on the first surface 71a of the silicon wafer 71. As shown in FIG. 10B, a fourth mask 81a is formed from the fifth insulating film 81 using photolithography and etching. The fourth mask 81a has respective opening patterns 81b and 81c in a part of the first region 71c and a part of the fourth region 71f. As shown in FIG. 10C, the first surface 71a of the silicon wafer 71, which is exposed at the opening patterns 81b and 81c, are etched with the fourth mask 81a to form recesses 85a and 85b. The depth DEP of the recesses 85a and 85b can be, for example, 25 micrometers as defined with respect to the first surface 71a. These recesses 85a and 85b are prepared for a margin for projecting a cutting blade in a later process of cutting the silicon wafer 71 using a cutting tool, such as a dicing saw, to form products. After forming the inner opening 79, as shown in FIG. 10D, the fourth mask 81a removed.

In step S204, an external opening for the front wall of the cap 15 is formed on the second surface 71b in the first region 71c and the second regions 71d in each of the arrayed sections on the single crystal semiconductor substrate. As shown in FIG. 11A, a sixth insulating film 87 and a seventh insulating film 89 are grown on the first surface 71a and the second surface 71b of the silicon wafer 71, respectively. Each of the sixth insulating film 87 and the seventh insulating film 89 may include, for example, a silicon oxide film. As shown in FIG. 11B, the application of photolithography to the seventh insulating film 89 can form a fifth mask 91 on the second surface 71b. The fifth mask 91 has a second opening pattern 91a for the outer opening defining an outer surface of the front wall 15b of the cap 15. FIG. 12 is a plan view showing a fifth mask 91 on the second surface 71b of the silicon wafer 71. In FIG. 12, the broken line drawn in the inside of the second opening pattern 91a indicates an external opening to be formed, the second opening pattern 91a has a rectangular shape extending in the other direction of the <110> and <11-0> axes (which is the same as that in which the first opening patterns 77a are arranged in FIG. 9), and in particular, the shape of the second opening pattern 91a can be a stripe shape extending across the sections. In this embodiment, the second opening pattern 91a extends so as to pass through the sections. The fifth mask 91 is used to carry out a wet etching process. As shown in FIG. 11C, the single-crystal silicon exposed at the second opening pattern 91a of the fifth mask 91 is etched with the fifth mask 91 using KOH solution as an etchant to form an outer opening 93. The etching should be carried out so as to leave a certain thickness between the first surface 71a and the bottom surface to be formed in the first region 71c. Too small thickness at the bottom surface of the silicon wafer 71 formed by etching causes the rigidity of the wafer to become weak, making the handling of the silicon wafer 71 in a later step difficult. The outer opening 93 has a bottom face 93a, one side face 93b and another side face 93c. The bottom face 93a extends in the direction of the first reference plane RE1F. The bottom face 93a of the outer opening 93 is provided in the first region 71c, and the side face 93b and the other side face 93c of the outer opening 93 is provided in the second region 71d in the first region 71c, respectively. The side face 93b of the outer opening 93 extends along the first outer reference plane RE12F inclined at an acute angle ACUT with respect to the first reference plane RE1F, and the other side face 93c of the outer opening 93 extends along the second outer reference plane RE22F. These side faces 93b and 93c of the outer opening 93 are provided with, for example, a (111) plane of silicon, and the bottom face 93a is provided with a (001) plane of silicon.

Figure 13:
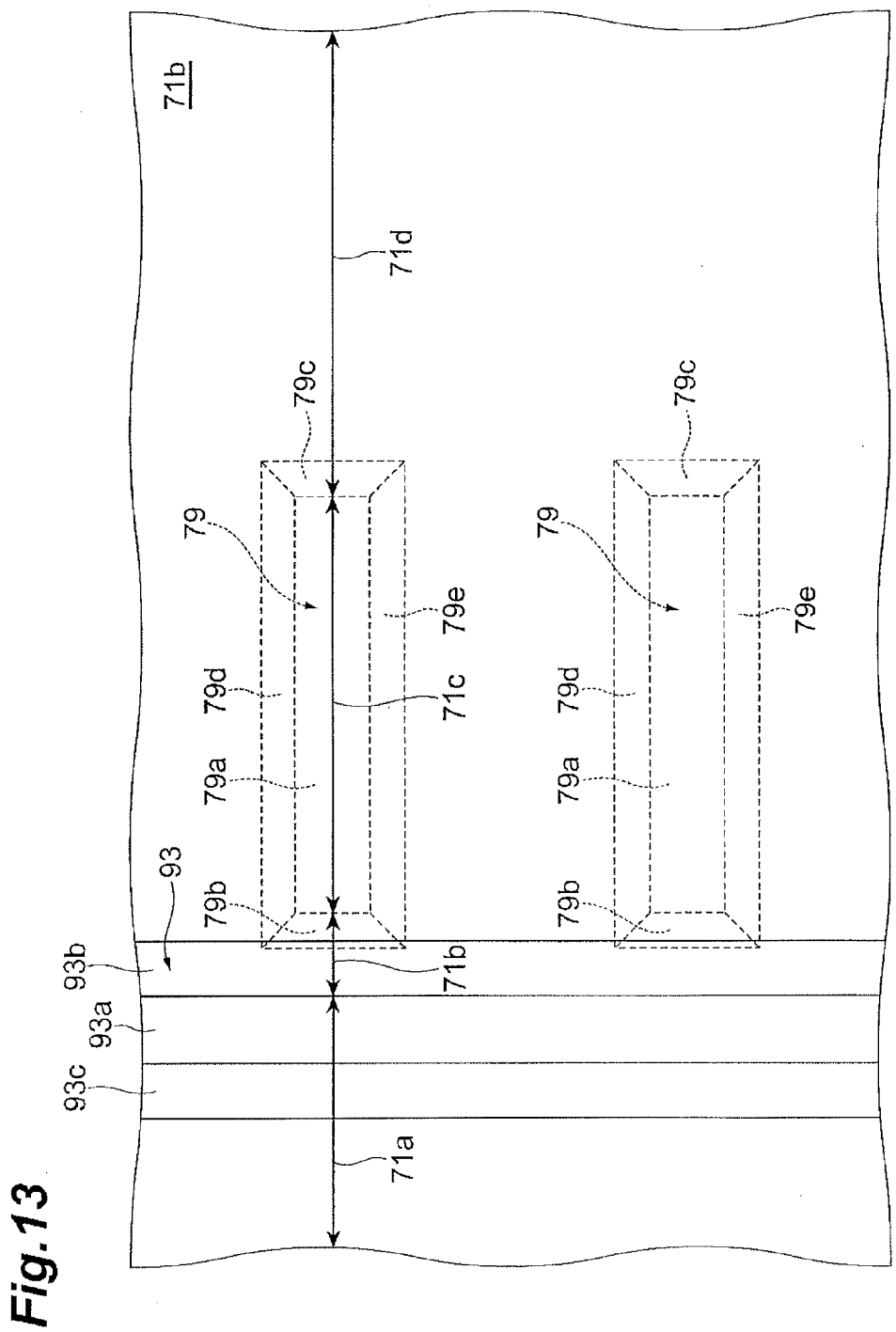
FIG. 13 is a plan view showing a major step in the method of making the cap product according to the present embodiment.

As shown in FIG. 11D, after forming the outer opening 93, the fifth mask 91 and the sixth insulating film 87 are removed. The second depth D2 of the outer opening 93 (for example, the level difference between the bottom surface 93a and the second surface 71b) is, for example, 675 micrometers, defined with respect to the second surface 71b, and can be in a range of 625 to 700 micrometers. FIG. 13 is a view showing the second surface 71b of the silicon wafer 71 in which the insulating film has been already removed. In the plan view of FIG. 13, the front inner face 79b and the side face 93b are on opposite sides of a region in the wafer to be stacked up. The closeness and difference in position between the inner opening 79 and the outer opening 93 relate to the thickness of the front wall 15b (thickness TH in FIG. 2) of the cap 15 to be fabricated by the present process flow, and this thickness is associated with the amount of shift between the optical axes (the amount of shift SHF in FIG. 2). This shows that the amount of shift SHF depends upon the arrangement of the inner opening 79 and the outer opening 93. The thickness of the front wall 15b can be, for example, about 100 micrometers. The thickness TH is defined in a direction perpendicular to, for example, (111) plane of silicon.

Figure 14:
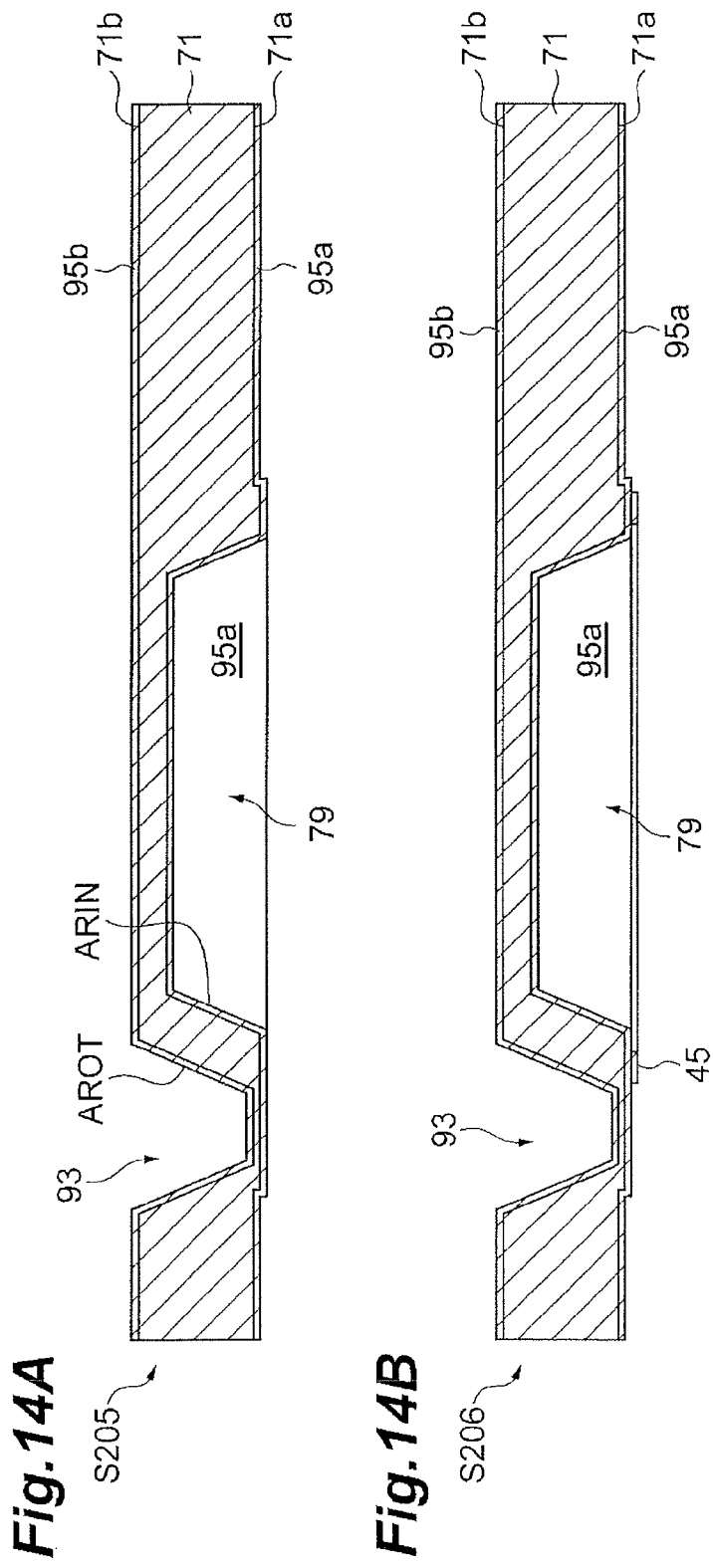
FIGS. 14A and 14B are cross sectional views each showing major steps in the method of making the cap product according to the present embodiment.

In step S205, after forming the inner opening 79 and the outer opening 93, as shown in FIG. 14A, the eighth insulating film 95a and the ninth insulating film 95b are grown on the first surface 71a and the second surface 71b of the silicon wafer 71, respectively. The eighth insulating film 95a and the ninth insulating film 95b each may have an insulating film usable as an anti-reflection film, such as silicon oxynitride film (SiON). Specifically, the anti-reflection film ARIN is disposed on the front inner face 79b of the inner opening 79, and the anti-reflection film AROT is disposed on the side face 93b of the outer opening 93.

After forming these insulating films, as shown in FIG. 14B, a sealing member is formed in step S206. For example, a metal member and/or an organic resin can be used as the sealing member, and in the present embodiment, a sealing member comprising a metallic material is formed. Specifically, an upper metal layer 45 for hermetic sealing is formed by a lift-off method. More specifically, a sacrificial layer having a pattern for lift-off is formed, and one or more metal films are grown by vapor deposition on the sacrificial layer. The sacrificial layer may be a resist film, and the metal film is grown to form, for example, Ti/Pt/Au/SuAg (100 nm/200 nm/50 nm/2000 nm). The silicon wafer 51 on which the metal film is deposited is immersed in a remover solution for the sacrificial layer to perform the lift-off of the metal film, so that the patterned metal film, which acts as the upper metal layer 45 in this embodiment, is formed in each section. The shape, location and size of the upper metal layer 45 can be consistent with those of the lower metal layer 39, respectively. In the present embodiment, the upper metal layer 45 is formed so as to surround the inner opening 79 for the cavity 25.

The above steps complete the cap product SPCP comprising an array of sections for the cap 15. The single-crystal semiconductor substrate to which the above processes have been applied is combined with the bench product to fabricate an assembly.

Figure 15:
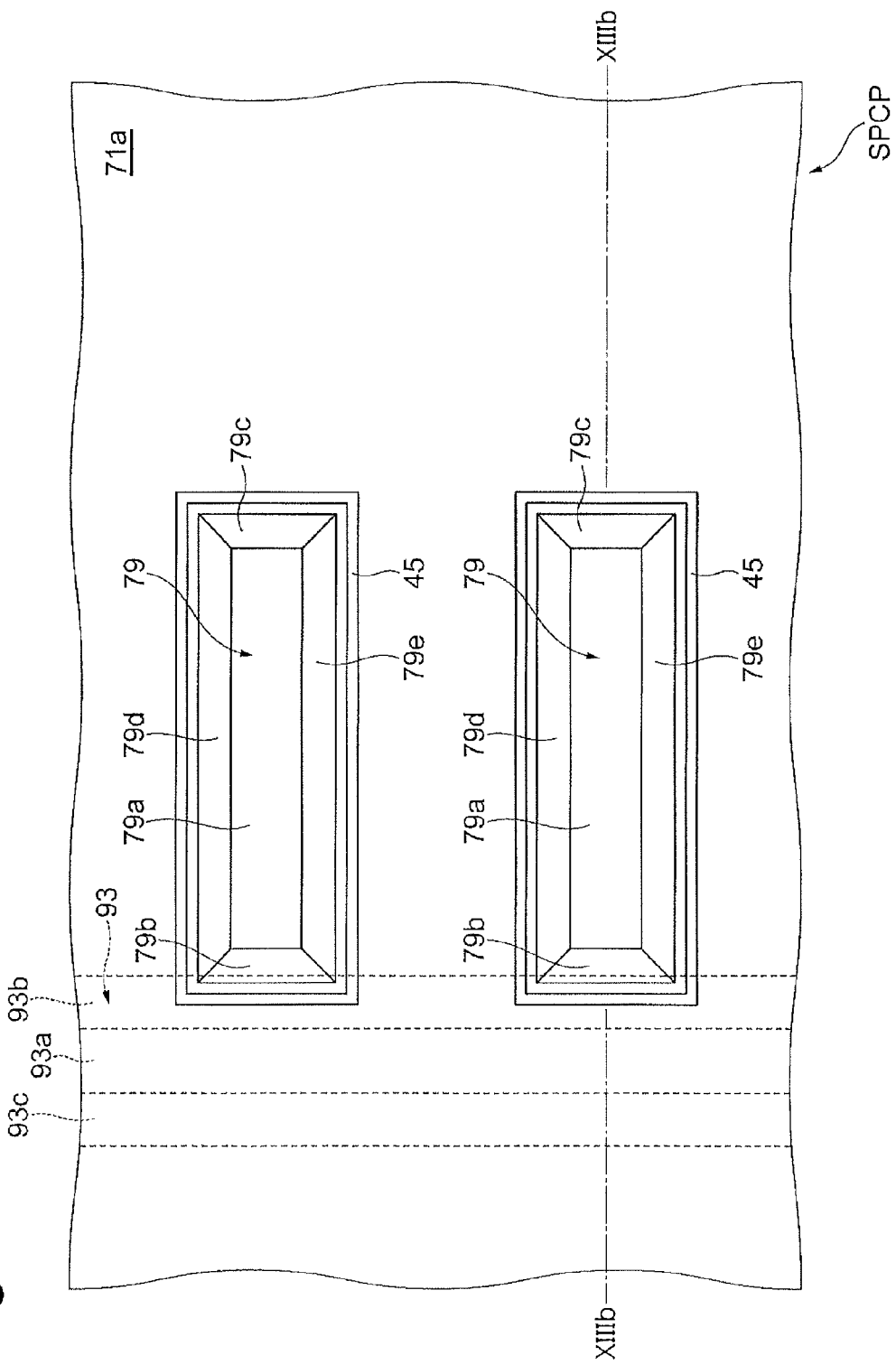
FIG. 15 is a plan view showing a major step in the method of making the cap product according to the present embodiment.

FIG. 15 is a view showing a first face 71a of the silicon wafer 71 on which the upper metal layer 45 has been formed. The cross-section shown in FIG. 14B is taken along the XIIIb-XIIIb line in FIG. 15. Referring to FIG. 15, the inner opening 79, which is on the first face 71a, is depicted by a solid line, and the outer opening 93, which is on the second face 71b, is depicted in a broken line. The front inner face 79b of the inner opening 79 and the side face 93b of the outer opening 93 extend in the same direction, and in a preferred embodiment, the front inner face 79b and the side face 93b are substantially parallel to each other, and include, for example, a (111) plane of silicon.

Figure 16:
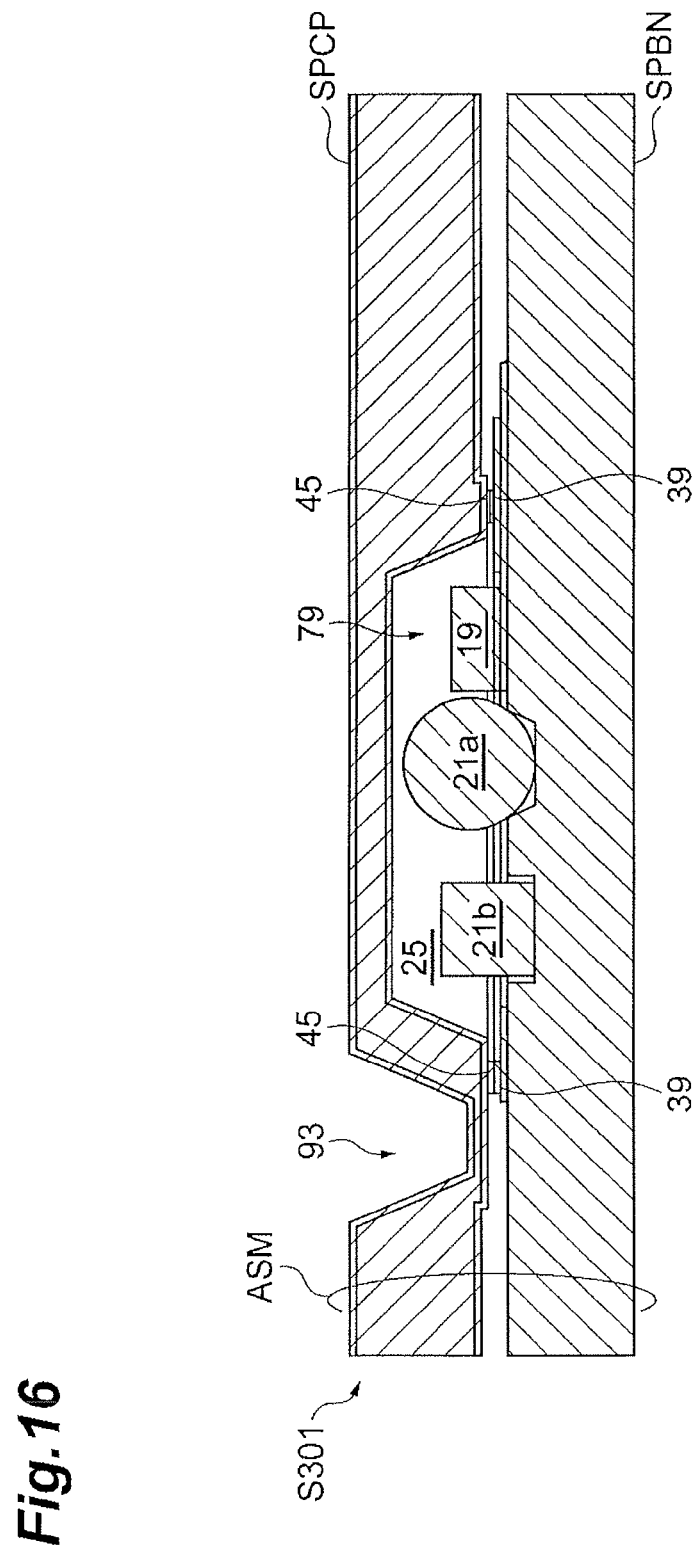
FIG. 16 is a cross sectional view showing a major step in the method of producing an optical module from the cap product and the bench products according to the present embodiment.

Processes to produce an optical module from the bench production SPBN and cap product SPCP will be described in detail below. As shown in FIG. 16, in step S301, the front inner face 79b of the inner opening 79 of the cap product SPCP is aligned to the axis on which the semiconductor optical device 19 and the optical component 21 are arrayed, so that one of the bench product SPBN and the cap product SPCP is positioned on the top of the other, and the products thus positioned are heat-treated to create a seal, thereby providing an assembly ASM made of the bench product SPBN and the cap product SPCP. In the alignment described above, the lower metal layer 39 and the upper metal layer 45 are aligned to each other. The heat treatment forms the junction between the lower metal layer 39 and the upper metal layer 45, so that the sealed cavity 25 is formed in each section. The cavity 25 provided by the inner opening 79 of the cap product SPCP contains the semiconductor optical device 19, the lens 21a and the optical isolator 21b of the bench production SPBN therein.

Figure 17:
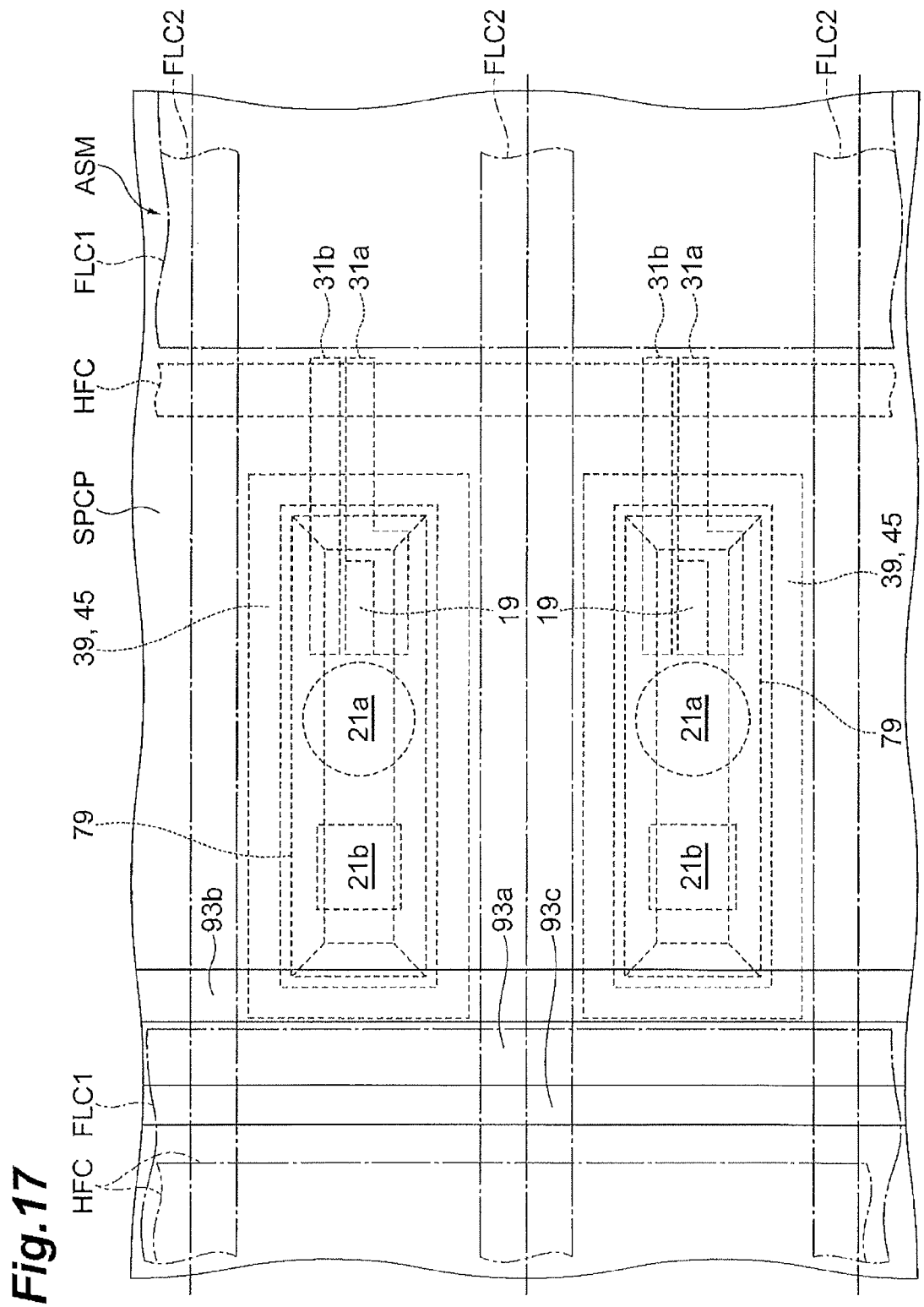
FIG. 17 is a schematic plan view showing an optical module product and separation lines in the method of fabricating the optical module according to the present embodiment.

The assembly ASM is divided by cutting to form an optical module. FIG. 17 shows the top of the cap product SPCP in the assembly ASM. The outer opening 93 appears on the top of the cap product SPCP. For example, cutting the assembly ASM in the following order can produce the optical module. The cap product SPCP is cut so as not to cut the bench product SPBN of the assembly ASM. This cutting process is referred to as "half cut" in the sense of only one of the products of the assembly being cut. The half-cut process is followed by cutting the remaining assembly made of both the cap product SPCP and the bench product SPBN. This cutting process is referred to as "full-cut" in the sense of both of the products being cutting.

Specifically, the half-cut HFC is carried out, for example in the direction in which the outer opening 93 extends, so that a rear end face of the rear wall 15c of the cap 15 is formed. The first full-cut FL1C is carried out, for example, in the direction in which the outer opening 93 extends, thereby forming a front wall of the optical module and a rear wall of another optical module. In this cutting process, the full cut (the process of cutting both of the cap product SPCP and the bench product SPBN left after a half-cut HFC) is carried out in the bottom face 93a of the outer opening 93 near the border to the side face 93b to form an end edge TIP of the front wall 15b for the optical module 11, and the bench product SPBN is cut so as to leave the electrodes 31a and 31b. Further, the second full cut FL2C is carried out, for example, in a direction crossing the direction in which the outer opening 93 extends, thereby forming the side faces of the optical module.

In step S302, a half cut HFC is carried out. As shown in FIG. 18, the cap product SPCP is cut so as not to cut the bench product SPBN of the assembly ASM, thereby exposing the electrodes 31a and 31b of the bench product SPBN. The cutting line for the separation is defined to extend in the direction of the outer opening 93. The above cutting is performed using a cutting device 97, such as dicing saw.

Then, in step S303, a first full cut FL1C is carried out. As shown in FIG. 19, both of the cap product SPCP and the bench product SPBN thus formed are cut to form the front and rear ends for the optical module. In the first full cut FL1C, a module bar is produced, and the module bar includes a row of sections each of which is prepared for the optical module 11. The cutting device 97, such as dicing saw, can be used to carry out the cutting process. Subsequently, a second full cut FL2C is carried out. Both of the cap product SPCP and bench product SPBN in the module bar are cut to form optical modules. The cutting device 97 can be also applied to this cutting process.

In the above manufacturing method, the outer opening 93 for separation is formed on the second surface 71b and has a bottom face 93a located in the first region 71c of the silicon wafer 71, and the inner opening 79 for the cavity is formed on the first surface 71a and has a bottom face 79a located in the third region 71e of the silicon wafer 71. The front inner surface 79b of the inner opening 79 and the side face 93b of the outer opening 93 are located in the second region 71d of the silicon wafer 71. The side face 93b of the outer opening 93 and the front inner face 79b of the inner opening 79 extends along the first inner reference plane RE11F and the first outer reference plane RE12F, respectively, and each of the first inner reference plane RE11F and the first outer reference plane RE12F is inclined at an acute angle ACUT to the first reference plane RE1F. A light beam passing through the front inner face 79b and the side face 93b is refracted at each of the front inner face 79b and the side face 93b, so that the intersection of the optical axis with the side face 93b of the outer opening 93 can be made higher than the intersection of the optical axis with the front inner face 79b of the inner opening 79 in the direction from the first face 71a of the silicon wafer 71 to the second face 71b with respect to the bottom face 93a of the outer opening 93. This difference in height can makes the intersection of the outer optical axis with the outer face of the front wall 15b apart from the bottom end of the side surface 93b of the outer opening 93 in the direction normal to the bottom surface 93a of the outer opening 93. Separating the assembly along the bottom face 93a of the outer opening 93 in the process of forming the cap 15 is likely to form the front end edge (TIP) having a non-uniform shape causing optical irregularity, and the difference in height also allows the front end edge to become apart from the intersection of the outer optical axis with the side face 93b of the outer opening 93.

The present embodiment described above can provide a method of producing an optical module that can be optically coupled to an external device without using the bottom face of the substrate of the optical module through a face of the optical module different from the bottom face.

EXAMPLE

The method according to the present embodiment described above is used to produce an LD module including a laser diode for the semiconductor optical device 19. The LD module has about several millimeters in height, longitudinal dimension and lateral dimension. In the LD module, as shown in FIG. 2, a laser beam emitted from the laser diode is focused by a lens. The condensed light beam is not incident perpendicularly on the Si (111) plane of the front wall of the cap, and is incident on the front wall, in particular, at an angle that is not a right angle (e.g. 54.7 degrees). The angle of incident is determined by the directional relationship of (111) plane and surface orientation of the silicon-based principal surface. The laser beam is refracted at the silicon semiconductor entrance face of the front wall to change the traveling direction with respect to the incident level in the direction from the bench of the LD module to the cap of the front wall because the refractive index of silicon semiconductor (about 3.4) is larger than the refractive index of air (about 1), and the laser beam propagating in the front wall of the cap is refracted at the emitting face of silicon semiconductor of the front wall and is emitted from the front wall at a higher emitting position than the incident position, and these refractions shift the height of the optical axis, and the emitted beam propagates parallel to the propagation direction of the incident light.

In the fabrication of the LD light module, the cap product SPCP is divided with a dicing saw, and as described above, the optical propagation path in the front wall of the silicon cap through which the laser beam passes is inclined away from the tip of the front wall which is produced by the dicing saw. The structure that allows a light beam to pass through the (111) inner and outer faces of the front wall of the cap at an angle inclined from the normal axis can be produced, and can prevent the tip of the front wall, which is produced by dicing in the production method, from affecting the propagation of light (e.g., the reduction in light scattering caused by the effect).

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:
1. An optical module including:
 a bench part including a bench having a principal surface with a first area and a second area, a semiconductor optical device disposed on the first area, and a lens disposed on the first area, the first area and the second area being arranged in a direction of a first axis; and
 a cap including a base made of silicon, the cap being disposed on the bench part,
 the cap having a cavity containing the semiconductor optical device and the lens therein,
 the cap including a ceiling extending along a first reference plane, a front wall extending from the ceiling along a second reference plane, and a rear wall extending from the ceiling in a direction from the cap to the bench,
 the semiconductor optical device, the lens and the cap being arranged along an optical reference plane, and
 the second reference plane being inclined at an acute angle with respect to the first reference plane.
2. The optical module according to claim 1, further including an optical isolator disposed on the first area of the bench, wherein the semiconductor optical device includes a laser diode.
3. The optical module according to claim 1, wherein the bench includes a base made of silicon, and
 the base of the bench includes an electrode mounting the semiconductor optical device thereon, and a recess positioning the lens.

* * * * *